United States Patent
Ochi et al.

(10) Patent No.: US 12,531,520 B2
(45) Date of Patent: *Jan. 20, 2026

(54) AMPLIFIER CONNECTED WITH A PLURALITY OF SPEAKERS

(71) Applicant: Roland Corporation, Shizuoka (JP)

(72) Inventors: Toshiyuki Ochi, Shizuoka (JP); Mitsuo Shida, Shizuoka (JP)

(73) Assignee: Roland Corporation, Shizuoka (JP)

( * ) Notice: Subject to any disclaimer, the term of this patent is extended or adjusted under 35 U.S.C. 154(b) by 220 days.

This patent is subject to a terminal disclaimer.

(21) Appl. No.: 18/307,800

(22) Filed: Apr. 27, 2023

(65) Prior Publication Data
US 2024/0178799 A1    May 30, 2024

(30) Foreign Application Priority Data
Nov. 24, 2022   (JP) ................. 2022-187235

(51) Int. Cl.
*H03F 3/183*   (2006.01)
*H03F 1/32*    (2006.01)
(Continued)

(52) U.S. Cl.
CPC ............. *H03F 3/183* (2013.01); *H03F 1/327* (2013.01); *H03F 3/181* (2013.01); *H04R 3/002* (2013.01);
(Continued)

(58) Field of Classification Search
CPC .......... H03F 1/327; H03F 3/183; H03F 3/181; H03F 2200/03; H04R 3/002; H04R 29/001
See application file for complete search history.

(56) References Cited

U.S. PATENT DOCUMENTS

| | | | | |
|---|---|---|---|---|
| 3,952,256 A | * | 4/1976 | Kosinski | H03F 1/565 330/276 |
| 6,859,538 B1 | * | 2/2005 | Voltz | G06F 3/162 381/101 |

(Continued)

FOREIGN PATENT DOCUMENTS

JP    2016171559    9/2016

OTHER PUBLICATIONS

"Office Action of Europe Related Application, Application No. 23169956.2", issued on Jan. 14, 2025, p. 1-p. 15.
(Continued)

*Primary Examiner* — Jason R Kurr
(74) *Attorney, Agent, or Firm* — JCIPRNET

(57) ABSTRACT

An amplifier includes an amplification section for amplifying a musical tone signal input from an electric musical instrument. A plurality of speakers are connected to the amplifier. The amplifier includes a selection section selecting a speaker for outputting the musical tone signal amplified by the amplification section, among the plurality of speakers, a storage section storing a characteristic adjustment value which is a value for adjusting an output impedance characteristic or an input impedance characteristic of the amplifier according to a characteristic of the speaker for each of the plurality of speakers, an acquisition section acquiring the characteristic adjustment value corresponding to the speaker selected by the selection section from the characteristic adjustment values stored in the storage section; and a characteristic adjustment section adjusting the output impedance characteristic or the input impedance characteristic based on the characteristic adjustment value acquired by the acquisition section.

20 Claims, 12 Drawing Sheets

(51) Int. Cl.
*H03F 3/181* (2006.01)
*H04R 3/00* (2006.01)
*H04R 29/00* (2006.01)

(52) U.S. Cl.
CPC ....... *H04R 29/001* (2013.01); *H03F 2200/03* (2013.01)

(56) References Cited

U.S. PATENT DOCUMENTS

| | | |
|---|---|---|
| 10,979,834 B2 | 4/2021 | Goto |
| 11,264,957 B2 | 3/2022 | Chou |
| 11,545,941 B2 | 1/2023 | Tarifa |
| 2013/0022210 A1 | 1/2013 | Vainiala |
| 2013/0034249 A1 | 2/2013 | Keir |
| 2013/0136278 A1 | 5/2013 | Quilter |
| 2015/0155839 A1* | 6/2015 | Buono ............... H03F 3/185 381/94.1 |
| 2017/0024495 A1 | 1/2017 | Wang et al. |
| 2017/0063315 A1* | 3/2017 | Dhanasekaran ........ H03F 1/56 |
| 2018/0316349 A1* | 11/2018 | Cheng ............... H03K 17/063 |
| 2020/0153392 A1 | 5/2020 | Miyoshi |
| 2022/0360900 A1 | 11/2022 | Lile |

OTHER PUBLICATIONS

"Search Report of Europe Related Application No. 23169956.2", issued on Oct. 12, 2023, pp. 1-15.

Ben Duncan, "High Performance Audio Power Amplifiers for Music Performance and Reproduction", Newnes, Jan. 1996, pp. 1-480.

"Office Action of Europe Related Application, Application No. 23169956.2", issued on Jun. 6, 2025, p. 1-p. 7.

"Office Action of U.S. Related Application, U.S. Appl. No. 18/307,796", issued on Sep. 25, 2025, p. 1-p. 31.

"Office Action of Europe Related Application No. 23169956.2", issued on Oct. 23, 2025, p. 1-p. 12.

* cited by examiner

Speaker data 21b

| Speaker | Rated impedance |
|---|---|
| First speaker | 4 Ω |
| Second speaker | 8 Ω | characteristic adjustment value data 21c

| Rated impedance | DF selection switch | Level adjustment |
|---|---|---|
| 4 Ω | R3a | Small |
| 8 Ω | R3b | Medium |
| 16 Ω | R3d | Large |
| : | : | : |

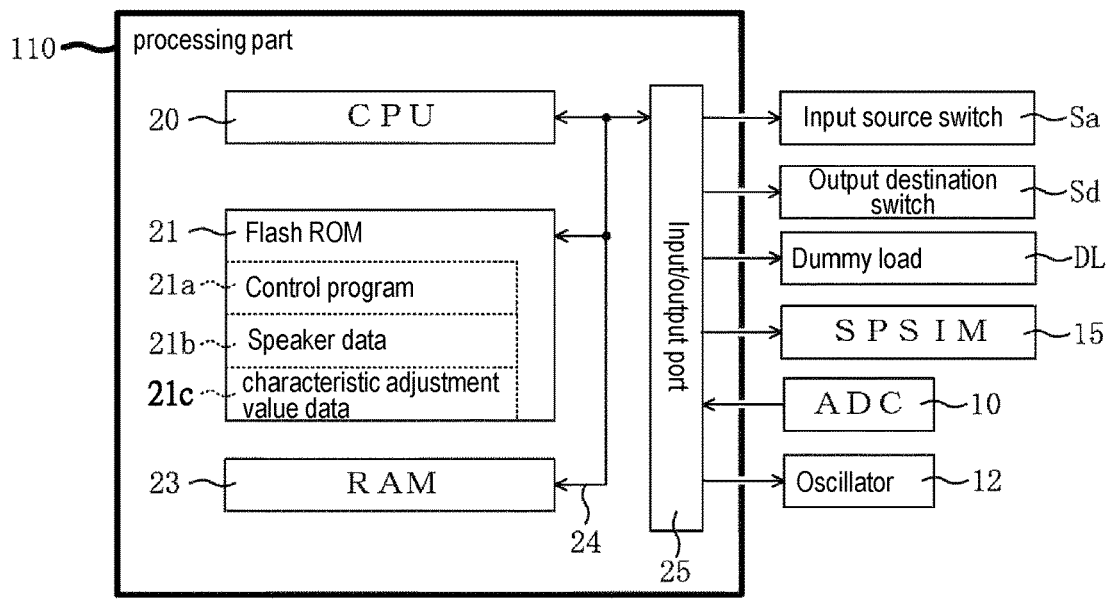

FIG. 9A

| Speaker | Rated impedance | High-frequency characteristic | Low-frequency characteristic |
|---|---|---|---|
| First speaker | 4Ω | H2 | L1 |
| Second speaker | 8Ω | H1 | L3 |

Speaker data 21b

FIG. 9B characteristic adjustment value data 21c

| Rated impedance | High-frequency characteristic | Low-frequency characteristic | Dummy load setting value | SPSIM setting value |
|---|---|---|---|---|
| 4Ω | H1 | L1 | D1 | SIM1 |
|  |  | L2 | D2 | SIM2 |
|  |  | L3 | D3 | SIM3 |
|  | H2 | L1 | D4 | SIM4 |
|  | ⋮ | ⋮ | ⋮ | ⋮ |
|  | H3 | L1 | D7 | SIM7 |
|  | ⋮ | ⋮ | ⋮ | ⋮ |
| 8Ω |  | H1 | L1 | D10 | SIM10 |
|  | ⋮ | ⋮ | ⋮ | ⋮ |
| ⋮ |  |  |  |  |

FIG. 9C

AMPLIFIER CONNECTED WITH A PLURALITY OF SPEAKERS

CROSS-REFERENCE TO RELATED APPLICATION

This application claims the priority benefits of Japanese application no. 2022-187235, filed on Nov. 24, 2022. The entirety of the above-mentioned patent application is hereby incorporated by reference herein and made a part of this specification.

BACKGROUND

Technical Field

The disclosure relates to an amplifier.

Description of Related Art

Patent Literature 1 discloses a power amplifier 1 that amplifies an audio signal AIN input from an electric musical instrument such as an electric guitar and outputs the amplified audio signal by a speaker SP. The power amplifier 1 is set with parameters corresponding to the characteristics such as the resistance value of the speaker SP, and by using these parameters, a sound based on the audio signal AIN can be output from the speaker SP with proper volume and quality.

RELATED ART

Patent Literature

[Patent Literature 1] Japanese Patent Laid-Open No. 2016-171559

However, in some cases, a plurality of speakers SP having different characteristics may be prepared, and it may be desired to switch to a speaker SP having characteristics suitable for the performance of an electric musical instrument such as backing or solo during the performance. Here, since only one speaker SP can be connected to the power amplifier 1, for example, it is necessary to prepare a power amplifier 1 set with parameters matching the speaker SP for each speaker SP, and switch the connection destination of the electric musical instrument to the power amplifier 1 connected to the speaker SP to be output from. In this case, there is a problem that it is required to prepare and install the same number of speakers SP for switching between combinations of the speakers SP and the power amplifiers 1.

In view of the above, the disclosure provides an amplifier capable of realizing switching between a plurality of output sections having different characteristics during performance of an electric musical instrument with a minimum configuration.

SUMMARY

An amplifier according to an embodiment of the disclosure includes an amplification section amplifying a musical tone signal input from an electric musical instrument, and the amplifier is connected with a plurality of speakers. The amplifier includes: a selection section selecting a speaker for outputting the musical tone signal amplified by the amplification section, among the plurality of speakers; a storage section storing a characteristic adjustment value which is a value for adjusting an output impedance characteristic or an input impedance characteristic of the amplifier according to a characteristic of the speaker for each of the plurality of speakers; an acquisition section acquiring the characteristic adjustment value corresponding to the speaker selected by the selection section from the characteristic adjustment values stored in the storage section; and a characteristic adjustment section adjusting the output impedance characteristic or the input impedance characteristic based on the characteristic adjustment value acquired by the acquisition section.

A method for adjusting a characteristic of an amplifier is provided. The amplifier is connected with a plurality of speakers. The method includes: selecting a speaker for outputting a musical tone signal amplified, among the plurality of speakers; storing a characteristic adjustment value which is a value for adjusting an output impedance characteristic or an input impedance characteristic of the amplifier according to a characteristic of the speaker for each of the plurality of speakers; acquiring the characteristic adjustment value corresponding to the speaker selected, from the characteristic adjustment values stored; and adjusting the output impedance characteristic or the input impedance characteristic based on the characteristic adjustment value acquired.

A method for adjusting a characteristic of an amplifier is provided. The amplifier is connected with a plurality of speakers. The method includes: selecting a speaker for outputting a musical tone signal amplified, among the plurality of speakers; storing a characteristic adjustment value which is a value for adjusting an output impedance characteristic or an input impedance characteristic of the amplifier according to a characteristic of the speaker for each of the plurality of speakers; and adjusting the output impedance characteristic or the input impedance characteristic based on the characteristic adjustment value corresponding to the speaker selected.

BRIEF DESCRIPTION OF THE DRAWINGS

FIG. 9A is a block diagram showing an electrical configuration of the processing part in the second embodiment, FIG. 9B is a diagram schematically showing the speaker data in the second embodiment, and FIG. 9C is a diagram schematically showing the characteristic adjustment value data in the second embodiment.

DESCRIPTION OF THE EMBODIMENTS

Figure 1:
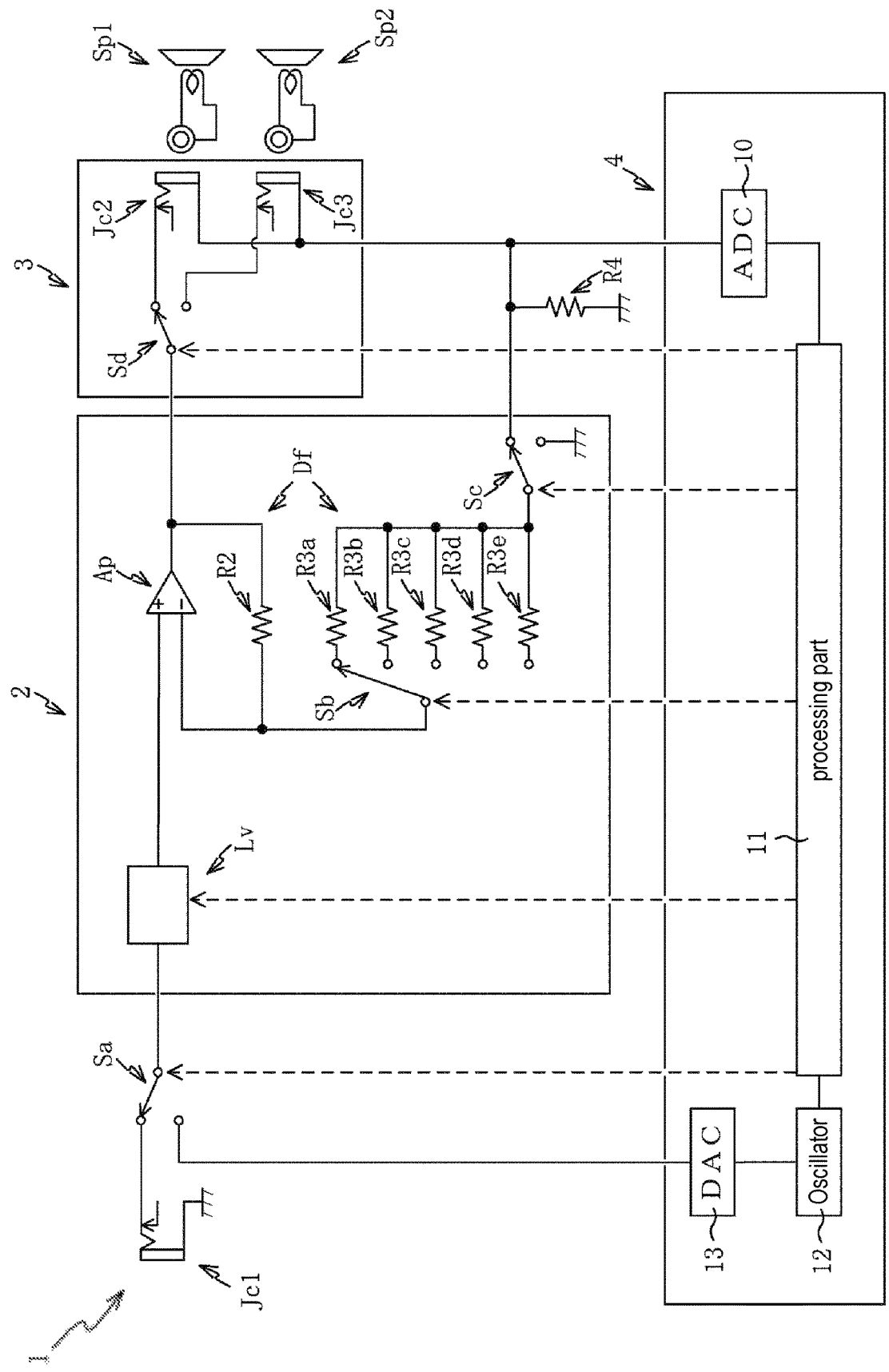
FIG. 1 is a diagram showing an overview of the amplifier as an embodiment.

Exemplary embodiments will be described hereinafter with reference to the accompanying drawings. FIG. 1 is a diagram showing an overview of an amplifier 1 as an embodiment. The amplifier 1 is a processing device that amplifies a musical tone signal input from an electric musical instrument such as an electric guitar and an electric bass (not shown) and outputs the amplified musical tone signal to a first speaker Sp1 or a second speaker Sp2. The amplifier 1 includes a first jack Jc1 for inputting a musical tone signal from the electric musical instrument, a characteristic adjustment part 2, an output part 3, and a controller 4.

The characteristic adjustment part 2 amplifies the musical tone signal input from the first jack Jc1 and changes the characteristics thereof, and is composed of a level adjustment part Lv, an operational amplifier Ap, and a damping factor Df. The level adjustment part Lv adjusts the level of the musical tone signal input from the first jack Jc1 according to the switching between the resistors R3a to R3e of the damping factor Df, which will be described later. In this embodiment, the level adjustment part Lv is realized by an attenuator based on resistive voltage division, but may be realized by other devices.

The operational amplifier Ap amplifies the musical tone signal input from the level adjustment part Lv. The operational amplifier Ap is provided with a non-inverting input terminal ("+" in the drawing) and an inverting input terminal ("−" in the drawing). The non-inverting input terminal of the operational amplifier Ap is connected to the level adjustment part Lv, and the inverting input terminal thereof is connected to the damping factor Df, which will be described later. Thus, the musical tone signal from the level adjustment part Lv, which is input to the operational amplifier Ap, is amplified according to the difference between the voltage of the musical tone signal input from the level adjustment part Lv and the negatively fed back voltage input from the damping factor Df, and is output from the operational amplifier Ap. Nevertheless, the amplifier for amplifying the input musical tone signal is not limited to the operational amplifier Ap, and other amplifiers or amplification devices may be used.

The damping factor Df is for controlling the voltage of the musical tone signal input to the inverting input terminal so that the musical tone signal output from the operational amplifier Ap is suitable for the rated impedances of the speakers Sp1 and Sp2. The output impedance characteristic of the amplifier 1 is adjusted by this damping factor Df. The damping factor Df is provided with a resistor R2 connected to the output side of the operational amplifier Ap, and the resistors R3a to R3e connected to jacks Jc2 and Jc3 (which will be described later) that are connected to the speakers Sp1 and Sp2.

The resistance values of the resistors R3a to R3e are set according to the rated impedances of the speakers Sp1 and Sp2 connected to the jacks Jc2 and Jc3, respectively. Specifically, the resistance values of the resistors R3a to R3e are set according to a negative feedback rate for negative feedback of the musical tone signal to the inverting input terminal of the operational amplifier Ap so that the damping factor of the musical tone signal output from the speakers Sp1 and Sp2 has a predetermined value (for example, "1") for each of the rated impedances of the speakers Sp1 and Sp2.

A DF selection switch Sb is provided for the resistors R3a to R3e. The DF selection switch Sb is a switch that selects one resistor, among the resistors R3a to R3e, to be connected to the resistor R2 and the inverting input terminal of the operational amplifier Ap according to an instruction from the controller 4, which will be described later. A parallel connection of the resistor R2 and one of the resistors R3a to R3e selected by the DF selection switch Sb is connected to the inverting input terminal of the operational amplifier Ap. That is, through selection of the DF selection switch Sb, the negative feedback rate of the musical tone signal to the inverting input terminal of the operational amplifier Ap is changed.

The output part 3 outputs the musical tone signal from the operational amplifier Ap, and includes the second jack Jc2 and the third jack Jc3 for outputting the musical tone signal, and an output destination switch Sd. The speaker Sp1 is connected to the second jack Jc2, and the speaker Sp2 is connected to the third jack Jc3. The speakers Sp1 and Sp2 are output devices for outputting (sounding) the musical tone signal from the operational amplifier Ap as a musical tone. In this embodiment, the speakers Sp1 and Sp2 have different rated impedances, but the speakers Sp1 and Sp2 may have the same rated impedance.

The output destination switch Sd is a switch for selecting the output destination of the musical tone signal from the operational amplifier Ap, among the jacks Jc2 and Jc3, according to an instruction from the controller 4, which will be described later. By outputting the musical tone signal from the operational amplifier Ap to the jack Jc2 or Jc3 selected by the output destination switch Sd, musical tones corresponding to the musical tone signal are output from the speakers Sp1 and Sp2 connected to the jacks Jc2 and Jc3, and the musical tone signal output via the operational amplifier Ap and the speakers Sp1 and Sp2 is output to the resistors R3a to R3e of the damping factor Df.

The controller 4 analyzes and stores switching instructions to the DF selection switch Sb and the output destination switch Sd and the rated impedances of the speakers Sp1 and Sp2. The controller 4 includes an ADC (Analog Digital Converter) 10, a processing part 11, an oscillator 12, and a DAC (Digital Analog Converter) 13.

The ADC 10 is connected to the jacks Jc2 and Jc3, and a resistor R4 is connected between the ADC 10 and the jacks Jc2 and Jc3. Thus, the ADC 10 is configured to be able to observe the voltage of the musical tone signal applied to the resistor R4. In addition, a constant voltage drive switch Sc is provided between the jacks Jc2 and Jc3 and the resistor R4 and the resistors R3a to R3e of the damping factor Df.

The constant voltage drive switch Sc is a switch that selects one of the jacks Jc2 and Jc3 and the ground (grounding) to be connected to the resistors R3a to R3e according to an instruction from the controller 4. When the resistors R3a to R3e are connected to the jacks Jc2 and Jc3 by the constant voltage drive switch Sc, amplification of the musical tone signal output from the operational amplifier Ap is controlled by negative feedback of the voltage from the resistors R3a to R3e and the resistor R2 to the inverting input terminal of the operational amplifier Ap.

On the other hand, when the resistors R3a to R3e are connected to the ground by the constant voltage drive switch Sc, as the voltage applied to the resistors R3a to R3e and the resistor R2 becomes 0V, negative feedback to the inverting input terminal is not performed. Thus, the amplifier 1 becomes "constant voltage drive" in which the output voltage from the operational amplifier Ap is constant (for example, 5V). Although details will be described with reference to FIG. 2, the rated impedances of the speakers Sp1 and Sp2 are analyzed from the output voltage from the operational amplifier Ap in constant voltage drive and the voltage applied to the resistor R4 which is observed by the ADC 10.

Hereinafter, such an operation mode for analyzing the rated impedances of the speakers Sp1 and Sp2 in the processing part 11 will be referred to as a "speaker characteristic measurement mode." The processing part 11 analyzes the rated impedances of the speakers Sp1 and Sp2 based on the voltage of an inspection signal acquired from the ADC 10 by the speaker characteristic measurement mode, and transmits a switching instruction to the DF selection switch Sb, etc. based on the analyzed rated impedances.

The oscillator 12 outputs a predetermined inspection signal to the DAC 13 according to an instruction from the processing part 11. The inspection signal is a musical tone signal used for analyzing the rated impedances of the speakers Sp1 and Sp2, and in this embodiment, the inspection signal is a sine wave with a frequency of 300 Hz.

In analyzing the rated impedances of the speakers Sp1 and Sp2, the inspection signal output from the oscillator 12 is used instead of the musical tone signal from the electric musical instrument input to the first jack Jc1. This is because the rated impedances of the speakers Sp1 and Sp2 are observed when the speakers Sp1 and Sp2 output a sound of 300 Hz. By using such an inspection signal for analyzing the rated impedances, the rated impedances can be accurately observed.

The frequency of the inspection signal is not limited to 300 Hz, and may be 300 Hz or higher or 300 Hz or lower depending on the characteristics of the speakers Sp1 and Sp2. Furthermore, the waveform of the inspection signal is not limited to a sine wave, and other waveforms such as a rectangular wave, a triangular wave, and a chirp wave may be used.

In this embodiment, the functions of the ADC 10, the processing part 11, the oscillator 12, and the DAC 13 are implemented by one MPU (Micro Processing Unit) or SoC (System-on-a-chip), but the configuration of the controller 4 is not limited thereto. For example, the ADC 10, etc. may be configured with separate devices. For example, the ADC 10, the processing part 11, and the DAC 13 may be implemented by an MPU or SoC, the oscillator 12 may be implemented by another device, and some of the functions of the ADC 10, etc. may be implemented by an MPU or Soc.

An input source switch Sa is provided between the first jack Jc1 and the characteristic adjustment part 2. The input source switch Sa is a switch for selecting either the musical tone signal from the first jack Jc1 or the inspection signal from the DAC 13 as input to the characteristic adjustment part 2 according to an instruction from the controller 4 (processing part 11).

When analyzing the rated impedances of the speakers Sp1 and Sp2, the processing part 11 first connects the output destination switch Sd to the jacks Jc2 and Jc3 corresponding to the speakers Sp1 and Sp2 whose rated impedances are to be analyzed, and connects the input source switch Sa to the DAC 13. Then, the constant voltage drive switch Sc is connected to the ground to switch the amplifier 1 to constant voltage drive.

After the switches Sa, Sc, and Sd are connected in this manner, the inspection signal is output from the oscillator 12 to the characteristic adjustment part 2 via the DAC 13, the voltage resulting from passing through the characteristic adjustment part 2 and the speakers Sp1 and Sp2 is observed by the ADC 10, and the rated impedance is analyzed based on the observed voltage. Here, the analysis of the rated impedance will be described with reference to FIG. 2.

Figure 2:
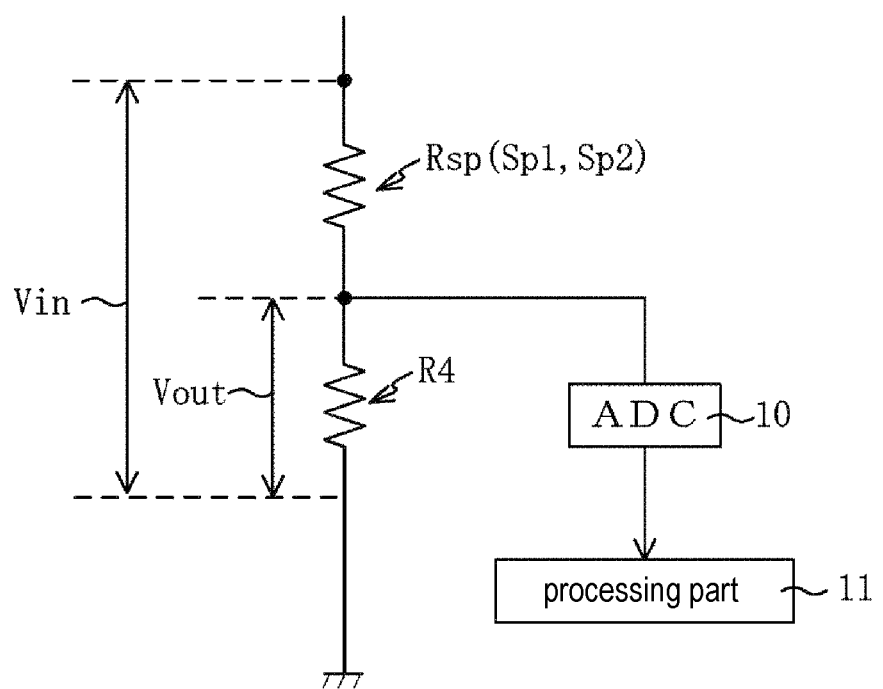
FIG. 2 is a diagram showing a circuit configuration when analyzing the rated impedance in the amplifier.

FIG. 2 is a diagram showing a circuit configuration when analyzing the rated impedance in the amplifier 1. As described above, when analyzing the rated impedance, the amplifier 1 becomes constant voltage drive, and the voltage applied to the entirety of the speakers Sp1 and Sp2 and the resistor R4 becomes a constant voltage Vin. Assuming that the resistance value of the resistor R4 is r4 and the voltage applied to the resistor R4, which is observed by the ADC 10, is Vout, a resistance value rsp when the speakers Sp1 and Sp2 are a resistor Rsp is calculated by the following formula 1.

[Formula 1]

$$rsp = r4 \cdot \left( \frac{Vin}{Vout} - 1 \right) \qquad \text{(formula 1)}$$

When the inspection signal is output from the oscillator 12 and the DAC 13, the resistance value rsp calculated by the above formula 1 based on the voltage Vout observed by the ADC 10 is stored in the processing part 11 as the rated impedances of the speakers Sp1 and Sp2.

Such analysis of the rated impedance and storage in the processing part 11 are performed for both the speaker Sp1 and the speaker Sp2. After the analysis of the rated impedance and the storage in the processing part 11 are completed, the input source switch Sa is connected to the first jack Jc1, and the constant voltage drive switch Sc is connected to the jacks Jc2 and Jc3. Thus, the musical tone signal input from the first jack Jc1 is input to the characteristic adjustment part 2 and output from the jacks Jc2 and Jc3, and the musical tone signal output from the operational amplifier Ap and the musical tone signals output from the jacks Jc2 and Jc3 and the speakers Sp1 and Sp2 are negatively fed back to the operational amplifier Ap by the damping factor Df.

At this time, the processing part 11 acquires the rated impedances of the speakers Sp1 and Sp2 corresponding to the jacks Jc2 and Jc3 that are connected to the output destination switch Sd from the stored rated impedances, and connects the DF selection switch Sb to the resistors R3a to R3e corresponding to the acquired rated impedances. Thus, the input musical tone signal is adjusted by the damping factor Df based on the resistors R3a to R3e selected according to the speakers Sp1 and Sp2 used for output. That is, the output impedance characteristic of the amplifier 1 can be adapted to the speakers Sp1 and Sp2 that output musical tone signals, and therefore high-quality musical tones having appropriate damping factors can be output from the speakers Sp1 and Sp2.

Thereafter, when the connection is switched from the jacks Jc2 and Jc3 to which the output destination switch Sd is connected to other jacks Jc2 and Jc3, the processing part 11 acquires the rated impedances of the speakers Sp1 and Sp2 corresponding to those jacks Jc2 and Jc3, and connects the DF selection switch Sb to the resistors R3a to R3e corresponding to the acquired rated impedances. Thereby, high-quality musical tones having appropriate damping factors can also be output from the speakers Sp1 and Sp2 after switching.

In this way, among the rated impedances stored in the processing part 11, the rated impedances corresponding to the speakers Sp1 and Sp2 to which the output destination switch Sd is connected are acquired, and the DF selection switch Sb is connected to the resistors R3a to R3e corresponding to the acquired rated impedances. Since the output impedance characteristic of the amplifier 1 can be adapted to the speakers Sp1 and Sp2 that output musical tone signals, musical tone signals suitable for the characteristics of the speakers Sp1 and Sp2 can be output to the speakers Sp1 and Sp2 without providing an amplifier 1 for each of the speakers Sp1 and Sp2. Thus, switching between the speakers Sp1 and Sp2 that output musical tone signals can be realized with a minimum configuration of one amplifier 1.

Furthermore, the amplifier 1 is set to constant voltage drive, and the rated impedances of the speakers Sp1 and Sp2 are analyzed based on the inspection signal output from the oscillator 12, and stored in the processing part 11. Thus, a performer or the like who plays the electric musical instrument does not need to manually input the rated impedance to the processing part 11, and the processing part 11 can automatically store the rated impedances corresponding to the speakers Sp1 and Sp2. Thus, it is possible to save the performer or the like from the trouble of setting the amplifier 1, and improve the usability of the amplifier 1.

Figure 3:
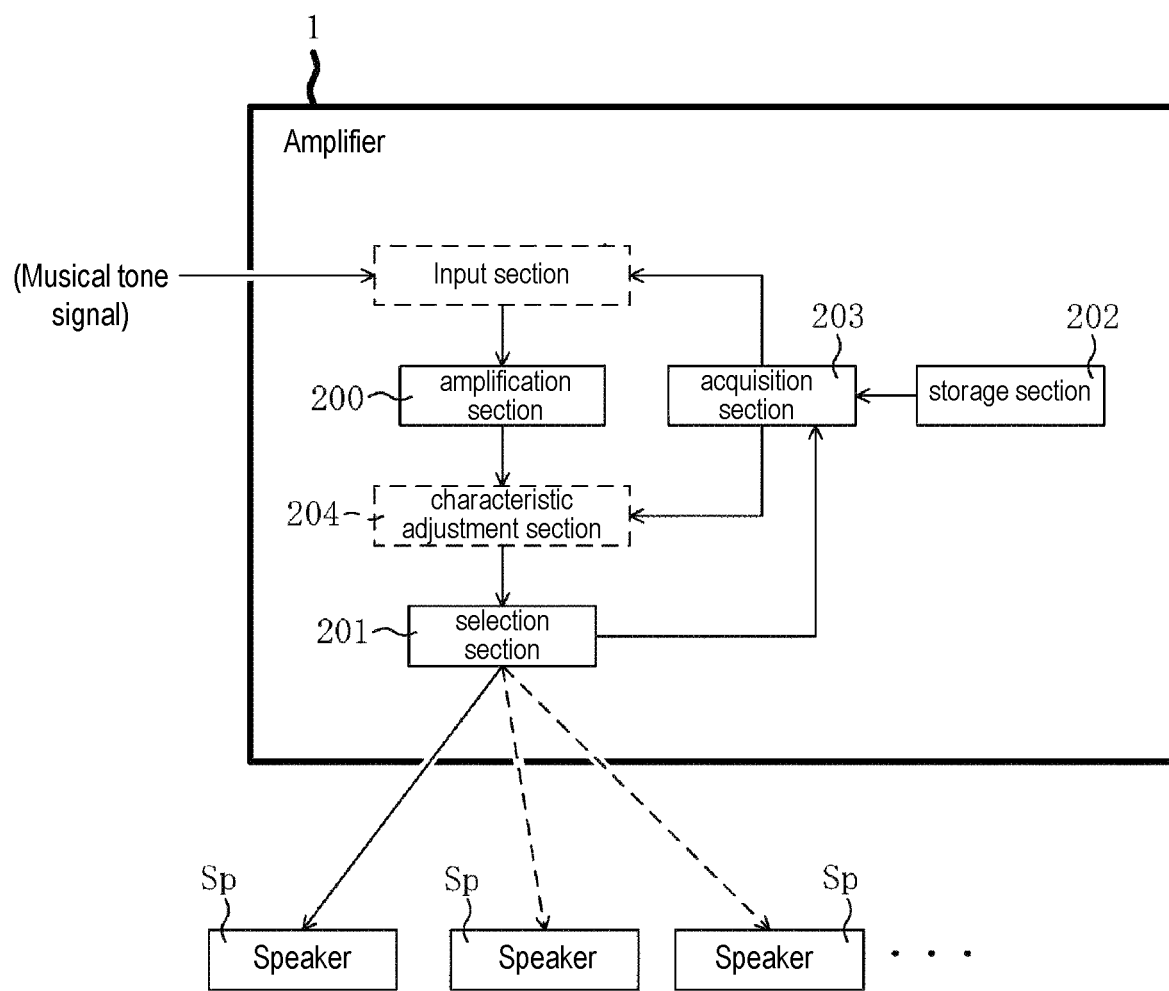
FIG. 3 is a functional block diagram of the amplifier.

Next, the functions of the amplifier 1 will be described with reference to FIG. 3. FIG. 3 is a functional block diagram of the amplifier 1. As shown in FIG. 3, the amplifier 1 is connected to a plurality of speakers Sp, and includes an amplification section 200, a selection section 201, a storage section 202, an acquisition section 203, and a characteristic adjustment section 204.

The amplification section 200 is a section for inputting a musical tone signal from the electric musical instrument, and is implemented by the operational amplifier Ap. The selection section 201 is a section for selecting a speaker Sp for outputting the musical tone signal amplified by the amplification section 200, among the plurality of speakers Sp, and is implemented by the output destination switch Sd. The storage section 202 is a section for storing a characteristic adjustment value, which is a value for adjusting the output impedance characteristic or the input impedance characteristic of the amplifier 1 according to the characteristics of the speaker Sp for each of the plurality of speakers Sp, and is implemented by characteristic adjustment value data 21c, which will be described later with reference to FIG. 4C.

The acquisition section 203 is a section for acquiring the characteristic adjustment value corresponding to the speaker Sp selected by the selection section 201 from the characteristic adjustment values stored in the storage section 202, and is implemented by a CPU 20 of the processing part 11, which will be described later with reference to FIG. 4A to FIG. 4C. The characteristic adjustment section 204 is a section for adjusting the output impedance characteristic or the input impedance characteristic based on the characteristic adjustment value acquired by the acquisition section 203, and is implemented by the damping factor Df.

In the amplifier 1, the musical tone signal input from the electric musical instrument is amplified by the amplification section 200 and output from the speaker Sp selected by the selection section 201. At this time, among the characteristic adjustment values stored in the storage section 202, the acquisition section 203 acquires the characteristic adjustment value corresponding to the speaker Sp selected by the selection section 201, and the output impedance characteristic or the input impedance characteristic of the amplifier 1 is adjusted using the acquired characteristic adjustment value. Since a musical tone signal suitable for the characteristics of the speaker Sp can be output without providing an amplifier 1 for each speaker Sp, switching between the speakers Sp that output musical tone signals can be realized with a minimum configuration of one amplifier 1.

Next, an electrical configuration of the processing part 11 will be described with reference to FIG. 4A to FIG. 4C. FIG. 4A is a block diagram showing the electrical configuration of the processing part 11. The processing part 11 includes the CPU 20, a flash ROM 21, and a RAM 22, each of which is connected to an input/output port 24 via a bus line 23. The input source switch Sa, the DF selection switch Sb, the constant voltage drive switch Sc, the output destination switch Sd, the level adjustment part Lv, the ADC 10, and the oscillator 12 are connected to the input/output port 24.

The CPU 20 is an arithmetic device that controls each part connected by the bus line 23. The flash ROM 21 is a rewritable non-volatile memory, and has a control program 21a, speaker data 21b, and characteristic adjustment value data 21c. When the control program 21a is executed by the CPU 20, a main process of FIG. 5A is executed. The speaker data 21b and the characteristic adjustment value data 21c will be described with reference to FIG. 4B and FIG. 4C.

Figures 4A, 4B, 4C:
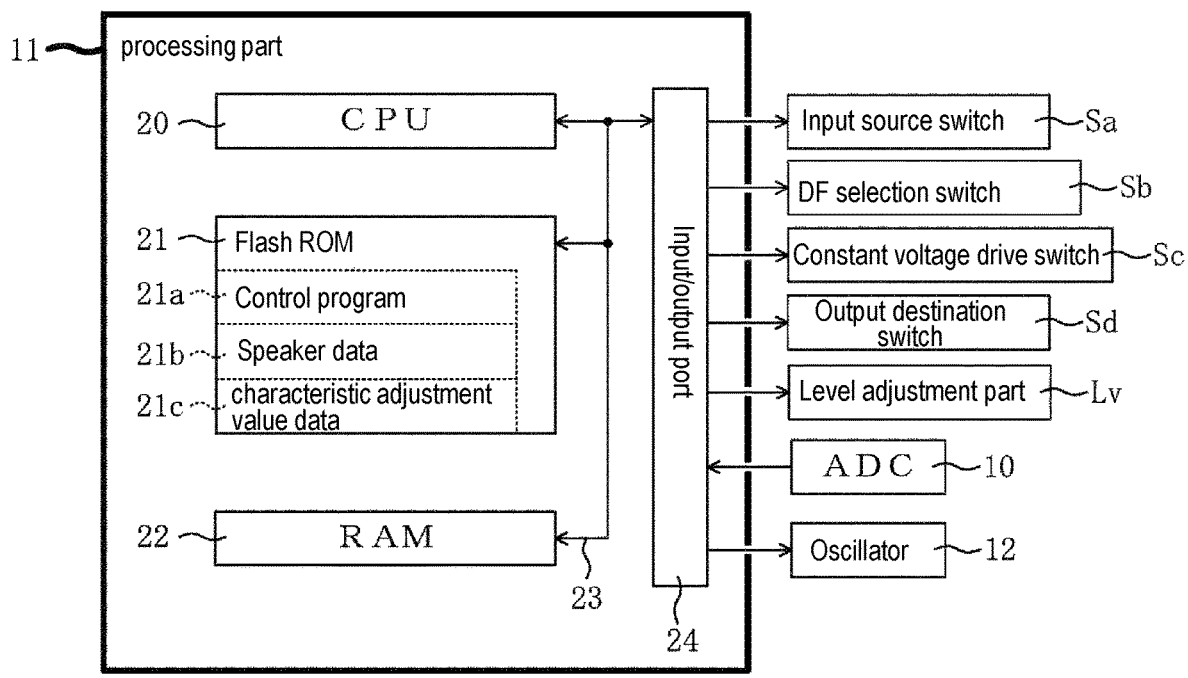
FIG. 4A is a block diagram showing an electrical configuration of the processing part.
FIG. 4B is a diagram schematically showing the speaker data.
FIG. 4C is a diagram schematically showing the characteristic adjustment value data.

FIG. 4B is a diagram schematically showing the speaker data 21b, and FIG. 4C is a diagram schematically showing the characteristic adjustment value data 21c. As shown in FIG. 4B, the speaker data 21b stores the analyzed rated impedance for each of the first speaker Sp1 and the second speaker Sp2. Further, as shown in FIG. 4C, the characteristic adjustment value data 21c stores, for each rated impedance, the suitable connection destination of the DF selection switch Sb (that is, the resistors R3a to R3e), and the degree of adjustment (small/medium/large) of the level of the musical tone signal input from the first jack Jc1 in the level adjustment part Lv. The connection destination of the DF selection switch Sb corresponding to the speakers Sp1 and Sp2 and the degree of adjustment of the level of the musical tone signal, which are stored in the characteristic adjustment value data 21c, are set as the "characteristic adjustment value."

The rated impedances of the speakers Sp1 and Sp2, which are the output destinations of the musical tone signal, are acquired from the speaker data 21b, and furthermore the connection destination of the DF selection switch Sb corresponding to the acquired rated impedance and the degree of adjustment of the level in the level adjustment part Lv are acquired from the characteristic adjustment value data 21c. The acquired connection destination of the DF selection switch Sb and degree of adjustment of the level in the level adjustment part Lv are applied to the characteristic adjustment part 2.

Please return to FIG. 4A. The RAM 22 is a memory that rewritably stores various work data, flags, or the like when the CPU 20 executes programs such as the control program 21a.

Next, the processing executed by the CPU 20 of the processing part 11 will be described with reference to FIG. 5A, FIG. 5B, FIG. 6A, and FIG. 6B. FIG. 5A is a flowchart of the main process. The main process is a process executed when the power of the processing part 11 is turned on.

In the main process, first, it is confirmed whether the operation mode of the processing part 11 is the speaker characteristic measurement mode (S1). In this embodiment, switching of the operation mode for the processing part 11 is performed by an operator (not shown) such as a setting button provided on the amplifier 1. In the process of S1, when the operation mode is the speaker characteristic measurement mode (S1: Yes), 1 is set to a counter variable n (S2).

The counter variable n is a variable representing the speakers Sp1 and Sp2 whose rated impedances are to be analyzed. When the counter variable n is "1," it represents that the target whose rated impedance is to be analyzed is the first speaker Sp1, and when the counter variable n is "2," it represents that the target whose rated impedance is to be analyzed is the second speaker Sp2.

After the process of S2, the value of the counter variable n is confirmed (S3). When the value of the counter variable n is 1 in the process of S3 (S3: "1"), the output destination switch Sd is connected to the second jack Jc2 (S4). On the other hand, when the value of the counter variable n is 2 in the process of S3 (S3: "2"), the output destination switch Sd is connected to the third jack Jc3 (S5). After S4 and S5, a characteristic measurement process (S6) is executed. Here, the characteristic measurement process will be described with reference to FIG. 5B.

Figure 5B:
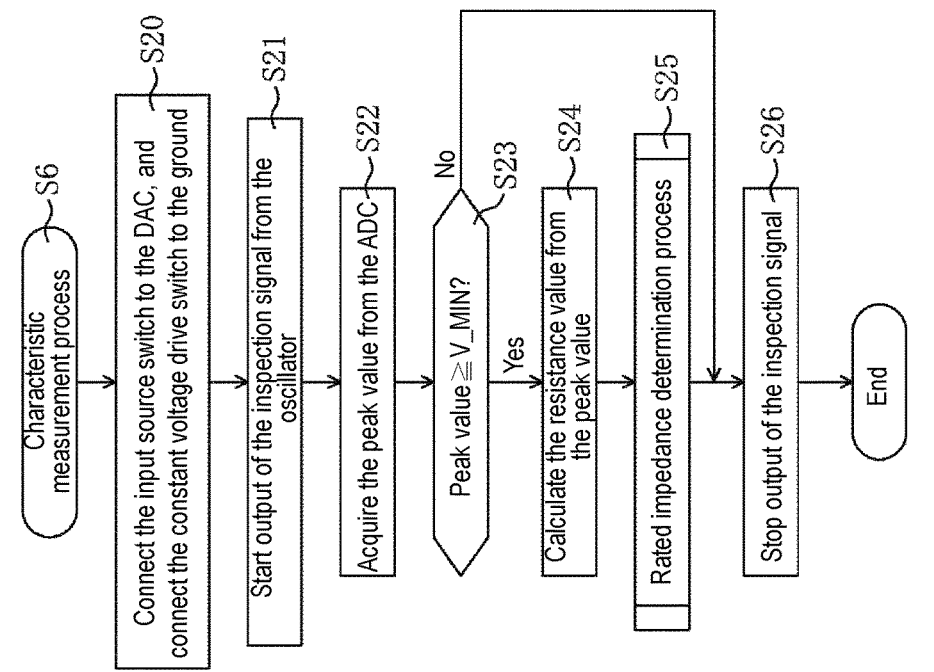
FIG. 5B is a flowchart of the characteristic measurement process.
Figure 5A:
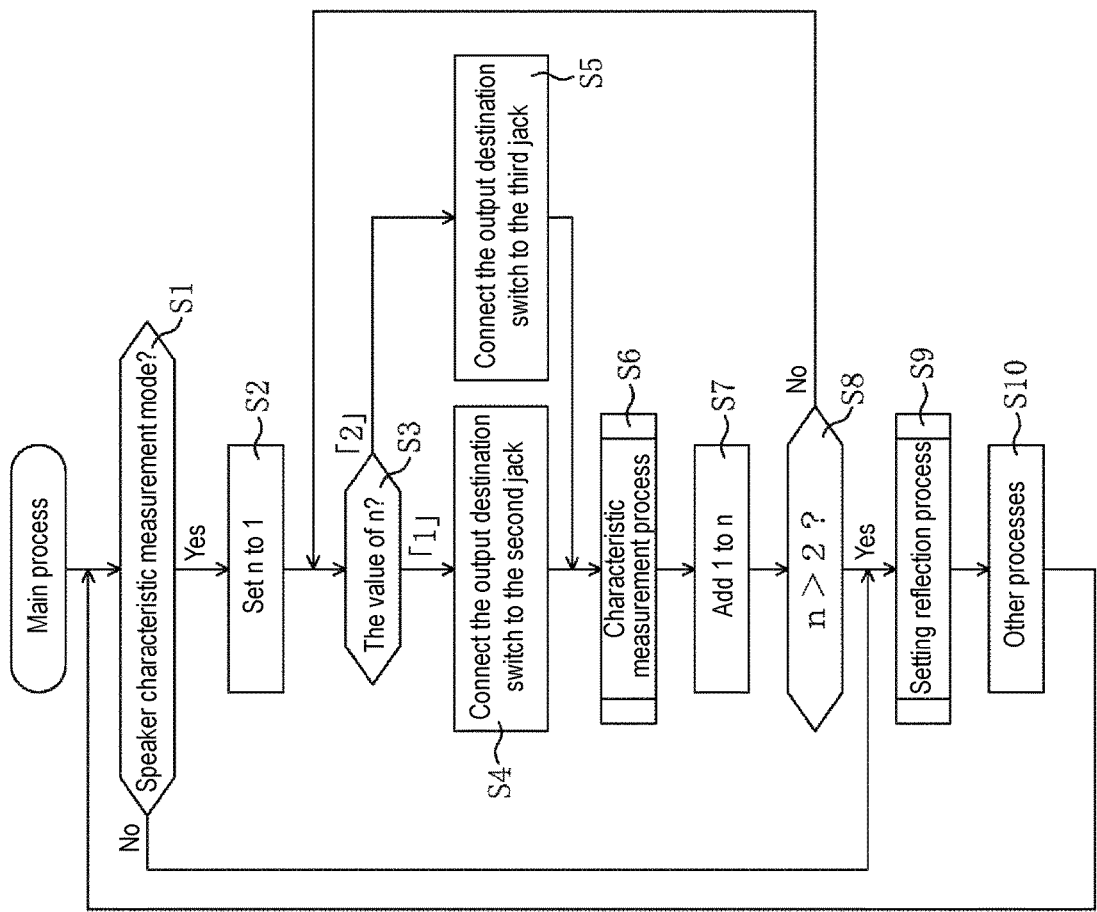
FIG. 5A is a flowchart of the main process.

FIG. 5B is a flowchart of the characteristic measurement process. In the characteristic measurement process, first, the input source switch Sa is connected to the DAC, and the constant voltage drive switch Sc is connected to the ground (S20). Thus, the amplifier 1 becomes constant voltage drive.

After the process of S20, output of the inspection signal from the oscillator 12 is started (S21). After the process of S21, the peak value of the voltage Vout from the ADC 10 is acquired (S22). After the process of S22, it is confirmed whether the peak value of the acquired voltage Vout is equal to or greater than V_MIN (S23). Although "4V" is exemplified as V_MIN in this embodiment, other voltages may be used.

In the process of S23, when the peak value of the voltage Vout is equal to or greater than the minimum value V_MIN (S23: Yes), the resistance value rsp is calculated from the peak value of the voltage Vout by the above formula 1 (S24). After the process of S24, a rated impedance determination process (S25) is executed. Here, the rated impedance determination process will be described with reference to FIG. 6A.

Figures 6A, 6B:
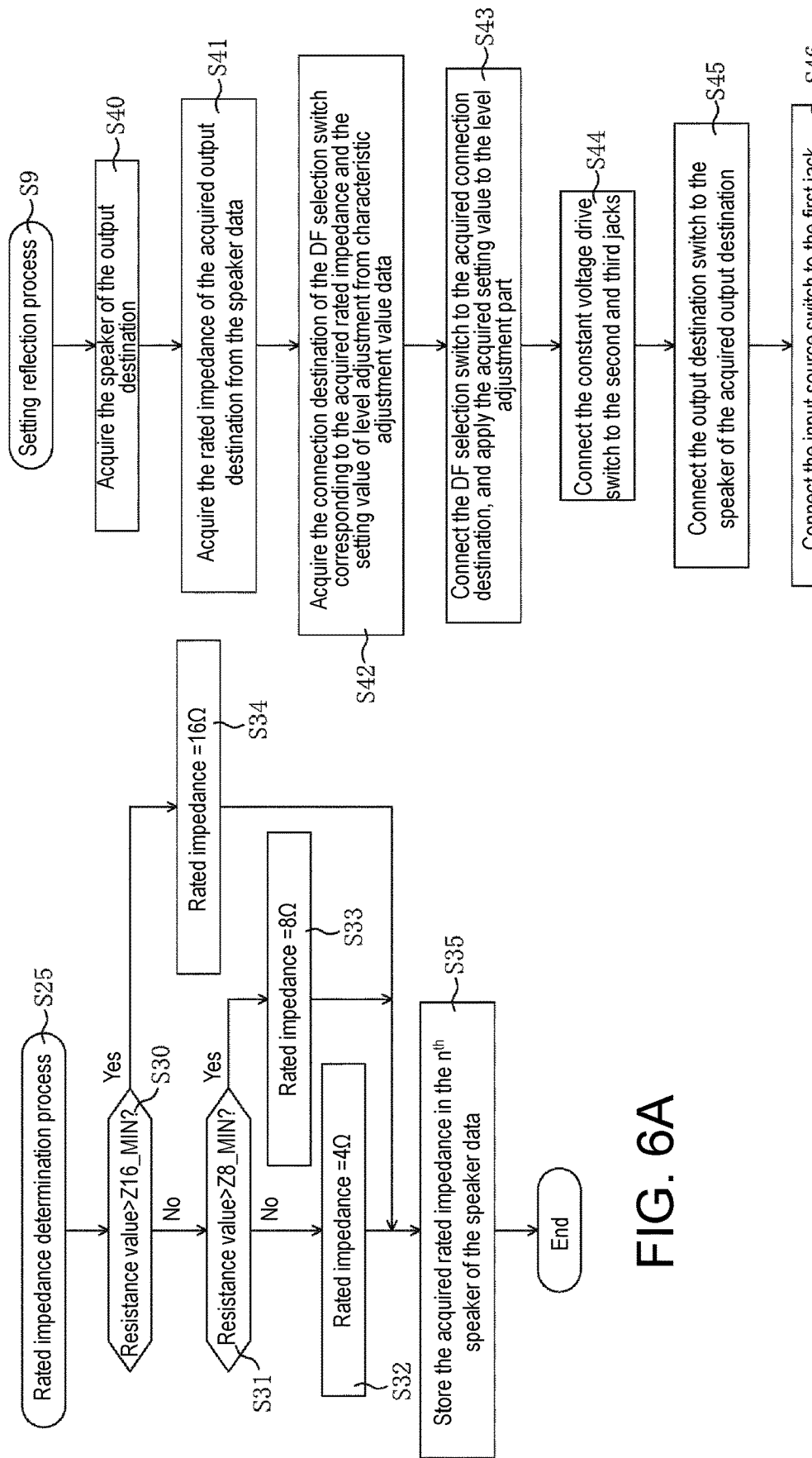
FIG. 6A is a flowchart of the rated impedance determination process.
FIG. 6B is a flowchart of the setting reflection process.

FIG. 6A is a flowchart of the rated impedance determination process. In the rated impedance determination process, first, it is confirmed whether the resistance value rsp calculated in S24 of FIG. 5B is greater than Z16_MIN (S30). Although "16Ω" is exemplified as Z16_MIN in this embodiment, other resistance values may be used.

In the process of S30, when the resistance value rsp is equal to or less than Z16_MIN (S30: No), it is confirmed whether the resistance value rsp is greater than Z8_MIN (S31). Although "8Ω" is exemplified as Z8_MIN in this embodiment, other resistance values may be used as long as they are less than Z16_MIN.

In the process of S31, when the resistance value rsp is equal to or less than Z8_MIN (S31: No), "4Ω" is set as the rated impedance (S32). On the other hand, in the process of S31, when the resistance value rsp is greater than Z8_MIN (S31: Yes), "8Ω" is set as the rated impedance (S33). Further, in the process of S30, when the resistance value rsp is greater than Z16_MIN (S30: Yes), "16Ω" is set as the rated impedance (S34).

After the processes of S32 to S34, the rated impedance set by these processes is stored in the rated impedance of the $n^{th}$ speaker of the speaker data 21b (S35). The "$n^{th}$ speaker" in the process of S35 represents either the first speaker Sp1 or the second speaker Sp2, and when "n" is "1" (that is, when the counter variable n is 1), it represents the first speaker Sp1, and when "n" is "2," it represents the second speaker Sp2. After the process of S35, the rated impedance determination process ends.

Please return to FIG. 5B. In the process of S23, when the peak value of the voltage Vout is less than V_MIN (S23: No), the processes of S24 and S25 are skipped. After the processes of S23 and S25, the output of the inspection signal from the oscillator 12 is stopped (S26), and the characteristic measurement process ends.

Please return to FIG. 5A. After the characteristic measurement process of S6, 1 is added to the counter variable n (S7), and it is confirmed whether the result is greater than 2 (S8). In the process of S8, when the counter variable n is equal to or less than 2 (S8: No), the analysis of the rated impedance of the second speaker Sp2 is not completed, so the process of S3 and subsequent processes are repeated. In the process of S1, when the operation mode is not the speaker characteristic measurement mode (S1: No), the processes of S2 to S8 are skipped.

After the processes of S1 and S8, a setting reflection process (S9) is executed. Here, the setting reflection process will be described with reference to FIG. 6B.

FIG. 6B is a flowchart of the setting reflection process. In the setting reflection process, first, among the first speaker Sp1 and the second speaker Sp2, the one to be used as the output destination for outputting the musical tone signal is acquired (S40). Specifically, in the process of S40, the output destination is acquired from an operator such as a setting button (not shown) or a mobile terminal (not shown) wirelessly connected to the amplifier 1.

After the process of S40, the rated impedance of the acquired output destination is acquired from the speaker data 21b (S41). After the process of S41, the connection destination of the DF selection switch Sb corresponding to the acquired rated impedance and the degree of adjustment of the level of the level adjustment part Lv are acquired from the characteristic adjustment value data 21c (S42). After the process of S42, the DF selection switch Sb is connected to the connection destination acquired in the process of S41, and the level adjustment part Lv is set to the degree of adjustment acquired in the process of S41 (S43).

After the process of S43, the constant voltage drive switch Sc is connected to the jacks Jc2 and Jc3 (S44), and the output destination switch Sd is connected to the output destination acquired in the process of S40 (S45). After the process of S45, the input source switch Sa is connected to the first jack Jc1 (S46), and the setting reflection process ends.

Through such a setting reflection process, the rated impedances of the speakers Sp1 and Sp2, which are the output destinations, are acquired from the speaker data 21b, the DF selection switch Sb is connected to the resistors R3a to R3e corresponding to the acquired rated impedance, and the level adjustment part Lv is set to the degree of adjustment of the level corresponding to the rated impedance. As a result, musical tone signals suitable for the speakers Sp1 and Sp2 are output from the characteristic adjustment part 2 to the speakers Sp1 and Sp2.

Please return to FIG. 5A. After the setting reflection process of S9, other processes of the amplifier 1 are executed (S10), and the processes from S1 onward are repeated.

Next, the second embodiment will be described with reference to FIG. 7 to FIG. 12A and FIG. 12B. The first embodiment described above illustrates the amplifier 1 having the damping factor Df which changes the output impedance characteristic according to the rated impedances of the speakers Sp1 and Sp2 that output musical tone signals. On the other hand, the second embodiment illustrates an amplifier 100 having a dummy load DL which changes the input impedance characteristic according to the rated impedances of the speakers Sp1 and Sp2 that output musical tone signals. The same reference numerals are assigned to the same parts as in the first embodiment described above, and the description thereof will be omitted.

Figure 7:
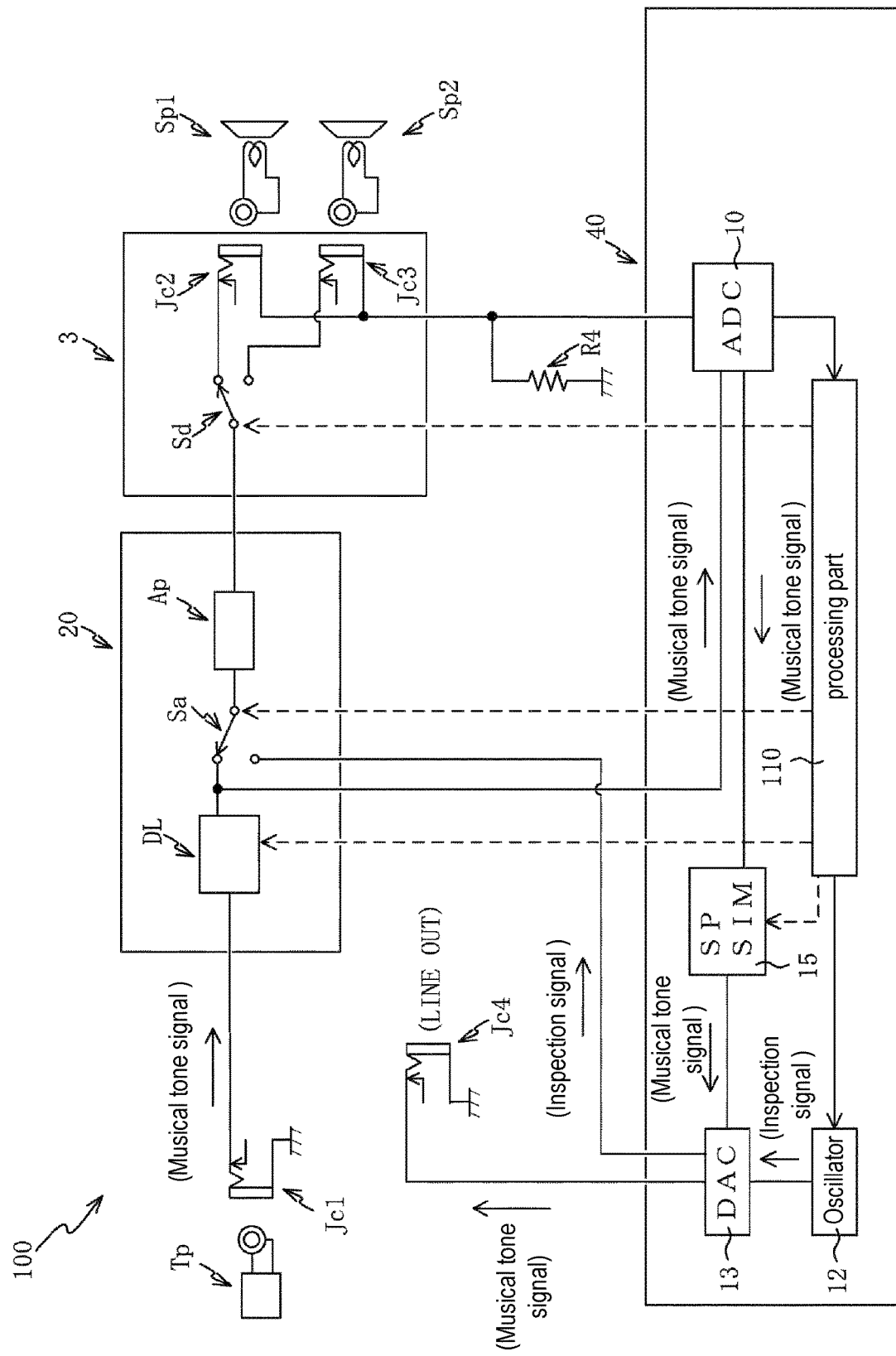
FIG. 7 is a diagram showing an overview of the amplifier in the second embodiment.

FIG. 7 is a diagram showing an overview of the amplifier 100 in the second embodiment. A vacuum tube amplifier Tp is connected to the first jack Jc of the amplifier 100. An electric musical instrument (not shown) such as an electric guitar is connected to the vacuum tube amplifier Tp, and a musical tone signal input from the electric musical instrument is amplified by the vacuum tube amplifier Tp and input to the first jack Jc.

The characteristic adjustment part 20 in the amplifier 100 is provided with a dummy load DL instead of the damping factor Df described in the first embodiment. With the omission of the damping factor Df, the DF selection switch Sb and the constant voltage drive switch Sc are also omitted from the characteristic adjustment part 20.

The dummy load DL changes the musical tone signal input from the first jack Jc so as to have the characteristics of the speakers Sp1 and Sp2. In the amplifier 100, the musical tone signal input from the first jack Jc is output from a line output Jc4, which will be described later, but at this time, the musical tone signal is simulated as if it were output from the speakers Sp1 and Sp2 by passing through the dummy load DL. With such a dummy load DL, the input musical tone signal is adjusted so that the input impedance characteristic of the amplifier 100 approximates the rated impedances of the simulated (or output) speakers Sp1 and Sp2.

The musical tone signal output from the dummy load DL is input to the operational amplifier Ap, the input musical tone signal is amplified by the operational amplifier Ap, and the amplified musical tone signal is output to the output part 3. Further, the input source switch Sa in the amplifier 100 is provided between the dummy load DL and the operational amplifier Ap, and either the musical tone signal of the dummy load DL or the inspection signal from the DAC 13 is selected as the input to the operational amplifier Ap according to an instruction from the controller 40 (processing part 110).

The ADC 10 in the processing part 110 of the amplifier 100 is configured so that the musical tone signal from the dummy load DL can be input. In addition, a SPSIM 15 is provided between the ADC 10 and the DAC 13. The SPSIM 15 changes the musical tone signal input from the ADC 10 to a frequency characteristic equivalent to the frequency characteristics of the speakers Sp1 and Sp2.

In the second embodiment, the functions of the processing part 110 are implemented by an MPU or SoC, and the respective functions of the oscillator 12 and the SPSIM 15 are implemented by a DSP (Digital Signal Processor). Further, the functions of the ADC 10 and the DAC 13 are respectively implemented by devices other than the MPU, SoC, and DSP. Nevertheless, the configuration of the controller 40 is not limited thereto, and similarly to the controller 4 of the first embodiment, all the functions of the controller 40 may be implemented by the MPU or SoC, or some of the functions of the ADC 10, etc. may be implemented by the MPU or SoC.

A setting value corresponding to the characteristics of the speakers Sp1 and Sp2 is input from the processing part 110 to the SPSIM 15, and a frequency characteristic based on the setting value is applied to the musical tone signal input from the ADC 10 and output to the DAC 13. The line output Jc4 for line-outputting the musical tone signal from the SPSIM 15 to a headphone, an earphone, or the like is connected to the DAC 13.

Similarly to the amplifier 1 of the first embodiment, the amplifier 100 of the second embodiment also analyzes the rated impedances of the speakers Sp1 and Sp2 connected to the jacks Jc2 and Jc3. In addition to the rated impedances, the amplifier 100 of the second embodiment also analyzes high-frequency characteristics and low-frequency characteristics of the speakers Sp1 and Sp2, which will be described later with reference to FIG. 8A and FIG. 8B.

When analyzing the high-frequency characteristics and the low-frequency characteristics of the speakers Sp1 and Sp2, the input source switch Sa is connected to the DAC 13, as in the first embodiment, and the inspection signal output from the oscillator 12 via the DAC 13 is output to the output part 3 via the operational amplifier Ap. At this time, the voltage Vout applied to the resistor R4 is observed by the ADC 10 according to the inspection signal output from the jacks Jc2 and Jc3, and the rated impedances, high-frequency characteristics, and low-frequency characteristics are analyzed based on the observed voltage Vout.

Figure 8A:
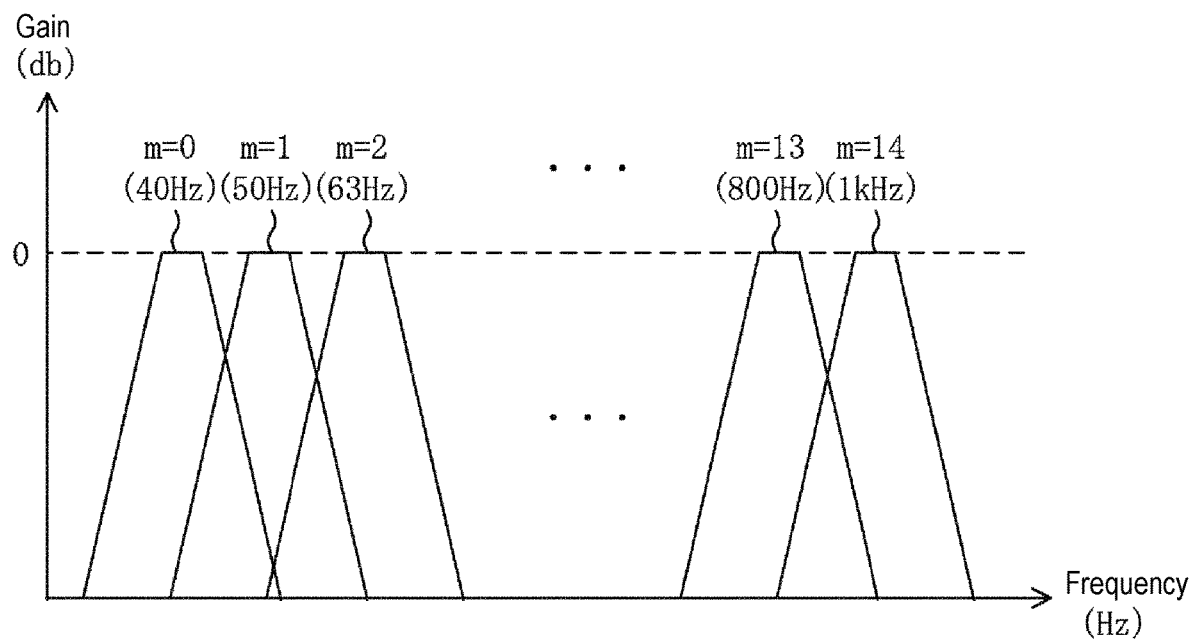
FIG. 8A is a diagram showing the bandpass filter used for analysis of the rated impedance, the high-frequency characteristics, and the low-frequency characteristics in the second embodiment.

Next, a method of analyzing the high-frequency characteristics and the low-frequency characteristics of the speakers Sp1 and Sp2 will be described with reference to FIG. 8A and FIG. 8B. FIG. 8A is a diagram showing a bandpass filter used for analysis of the high-frequency characteristics and the low-frequency characteristics. The processing part 110 has a plurality of bandpass filters. When white noise is output from the oscillator 12 to the characteristic adjustment part 20 as an inspection signal, the high-frequency characteristics and the low-frequency characteristics are analyzed according to the detected output level by applying the plurality of bandpass filters to the inspection signal observed by the ADC 10. The oscillator 12 is configured to be capable of outputting white noise in addition to the sine wave output in the first embodiment.

As shown in FIG. 8A, a first (m=0) bandpass filter with a center frequency of 40 Hz, a second (m=1) bandpass filter with a center frequency of 50 Hz, a third (m=2) bandpass filter with a center frequency of 63 Hz, . . . , a fifteenth (m=14) bandpass filter with a center frequency of 1 kHz are provided as the plurality of bandpass filters. Then, these bandpass filters are applied to the musical tone signal observed by the ADC 10. As a result, the musical tone signal from 40 Hz to 1 kHz is divided into fifteen frequency bands, and the output level of each frequency band is acquired.

Figure 8B:
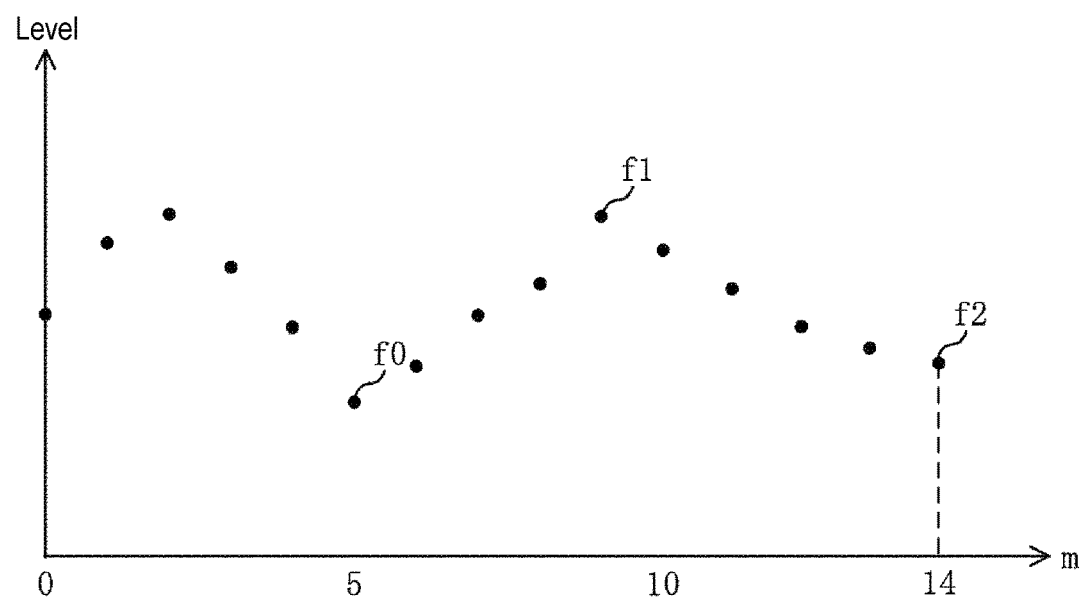
FIG. 8B is a diagram showing the output level acquired by each bandpass filter in the second embodiment.

FIG. 8B is a diagram showing the output level acquired by each bandpass filter. Three output levels f0, f1, and f2 are acquired for the analysis of the high-frequency characteristics and the low-frequency characteristics. The output level f0 is set to be the output level having the minimum value among the output levels acquired by the bandpass filters. In FIG. 8B, the output level f0 is set to be the output level observed by applying the sixth (m=5) bandpass filter with a center frequency of 200 Hz.

The output level f1 is set to be the output level having the maximum value among the output levels acquired by the bandpass filters. In FIG. 8B, the output level f1 is set to the output level observed by applying the tenth (m=9) bandpass filter. Then, the output level f2 is set to be the output level observed by applying the bandpass filter with the highest center frequency (that is, the fifteenth (m=14) bandpass filter).

Thus, the inspection signal is white noise having the same output level over a wide frequency band, and the output levels f0 to f2 resulting from passing the inspection signal through the characteristic adjustment part 20 and the speakers Sp1 and Sp2 are detected by the plurality of bandpass filters. Since the output levels f0 to f2 can be detected at once, the detection of the output levels f0 to f2 can be carried out efficiently, for example, compared to a case where the inspection signal is a sine wave and the frequency of the sine wave is switched step by step to repeatedly detect the output level of each frequency band.

The high-frequency characteristics and the low-frequency characteristics of the speakers Sp1 and Sp2 are calculated from the set output levels f0 to f2. Specifically, in this embodiment, the value obtained by dividing the output level f2 by the output level f1 is a value representing the high-frequency characteristic. The value obtained by dividing the output level f1 by the output level f0 is a value representing the low-frequency characteristic.

Values based on the calculated high-frequency characteristics and low-frequency characteristics are stored in the processing part 110 together with the acquired rated impedances in the same manner as in the first embodiment. When the input source switch Sa is connected to the dummy load DL and the musical tone signal is output from the line output Jc4, the rated impedances, high-frequency characteristics, and low-frequency characteristics corresponding to the simulated speakers Sp1 and Sp2 are acquired. The setting values of the dummy load DL and the SPSIM 15 suitable for the acquired rated impedances, high-frequency characteristics, and low-frequency characteristics are reflected in the dummy load DL and the SPSIM 15.

Next, an electrical configuration of the processing part 110 of the second embodiment will be described with reference to FIG. 9A to FIG. 9C. FIG. 9A is a block diagram showing the electrical configuration of the processing part 110 in the second embodiment. The SPSIM 15 described above is connected to the input/output port 25 of the processing part 110.

FIG. 9B is a diagram schematically showing the speaker data 21b in the second embodiment. As shown in FIG. 9B, the speaker data 21b in the second embodiment stores values based on the high-frequency characteristics and the low-frequency characteristics, in addition to the analyzed rated impedances, for each of the first speaker Sp1 and the second speaker Sp2. As the values based on the high-frequency characteristics, H1, H2, and H3 are set in ascending order of the values obtained by dividing the output level f2 by the output level f1, and as the values based on the low-frequency characteristics, L1, L2, and L3 are set in ascending order of the values obtained by dividing the output level f1 by the output level f0. Hereinafter, "values based on the high-frequency characteristics" and "values based on the low-frequency characteristics" are referred to as "high-frequency characteristics" and "low-frequency characteristics."

FIG. 9C is a diagram schematically showing the characteristic adjustment value data 21c. As shown in FIG. 9C, the characteristic adjustment value data 21c stores the setting value of the dummy load DL and the setting value of the SPSIM 15 corresponding to each combination of rated impedance, high-frequency characteristic, and low-frequency characteristic. As the setting value of the dummy load DL stored in the speaker data 21b, a setting value is set such that the high-frequency characteristic of the dummy load DL increases as the high-frequency characteristics increase, and a setting value is set such that the low-frequency characteristic of the dummy load DL increases as the low-frequency characteristics increase.

The setting value of the dummy load DL and the setting value of the SPSIM 15 according to the combination of the rated impedance, the high-frequency characteristic, and the low-frequency characteristic, which are stored in the characteristic adjustment value data 21c, are set as "characteristic adjustment values."

Figure 10:
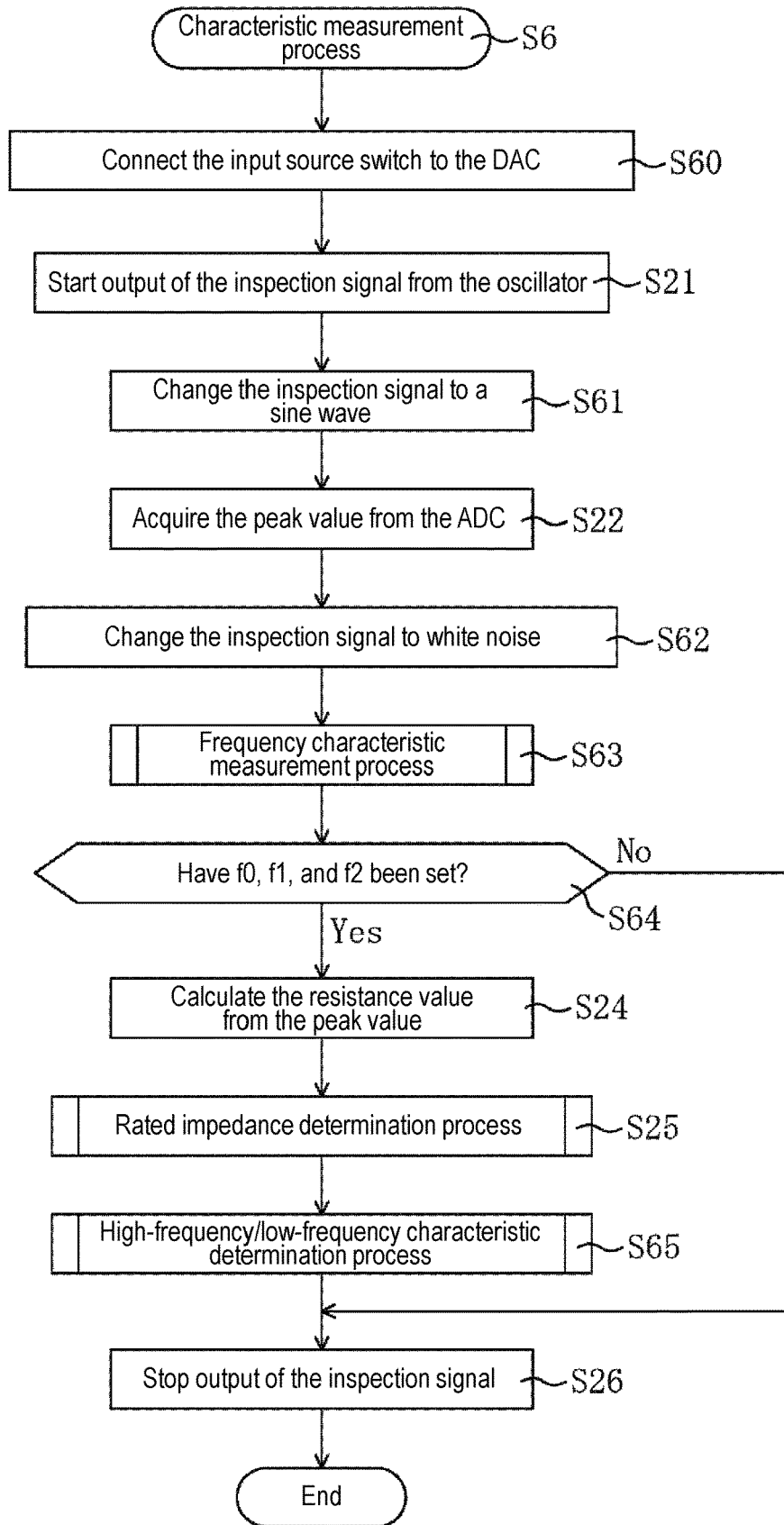
FIG. 10 is a flowchart of the characteristic measurement process in the second embodiment.

Next, the processing executed by the CPU 20 of the processing part 110 will be described with reference to FIG. 10 to FIG. 12A and FIG. 12B. FIG. 10 is a flowchart of the characteristic measurement process in the second embodiment. The characteristic measurement process in the second embodiment first connects the input source switch Sa to the DAC (S60). After the process of S60, the output of the inspection signal from the oscillator 12 is started by the process of S21.

After the process of S21, the inspection signal output from the oscillator 12 is changed to a sine wave with a frequency of 300 Hz for analysis of the rated impedance (S61). After the process of S61, the peak value of the voltage Vout from the ADC 10 is acquired by the process of S22. After the process of S22, the inspection signal output from the oscillator 12 is changed to white noise (S62). After the process of S62, a frequency characteristic measurement process (S63) is executed. Here, the frequency characteristic measurement process will be described with reference to FIG. 11.

Figure 11:
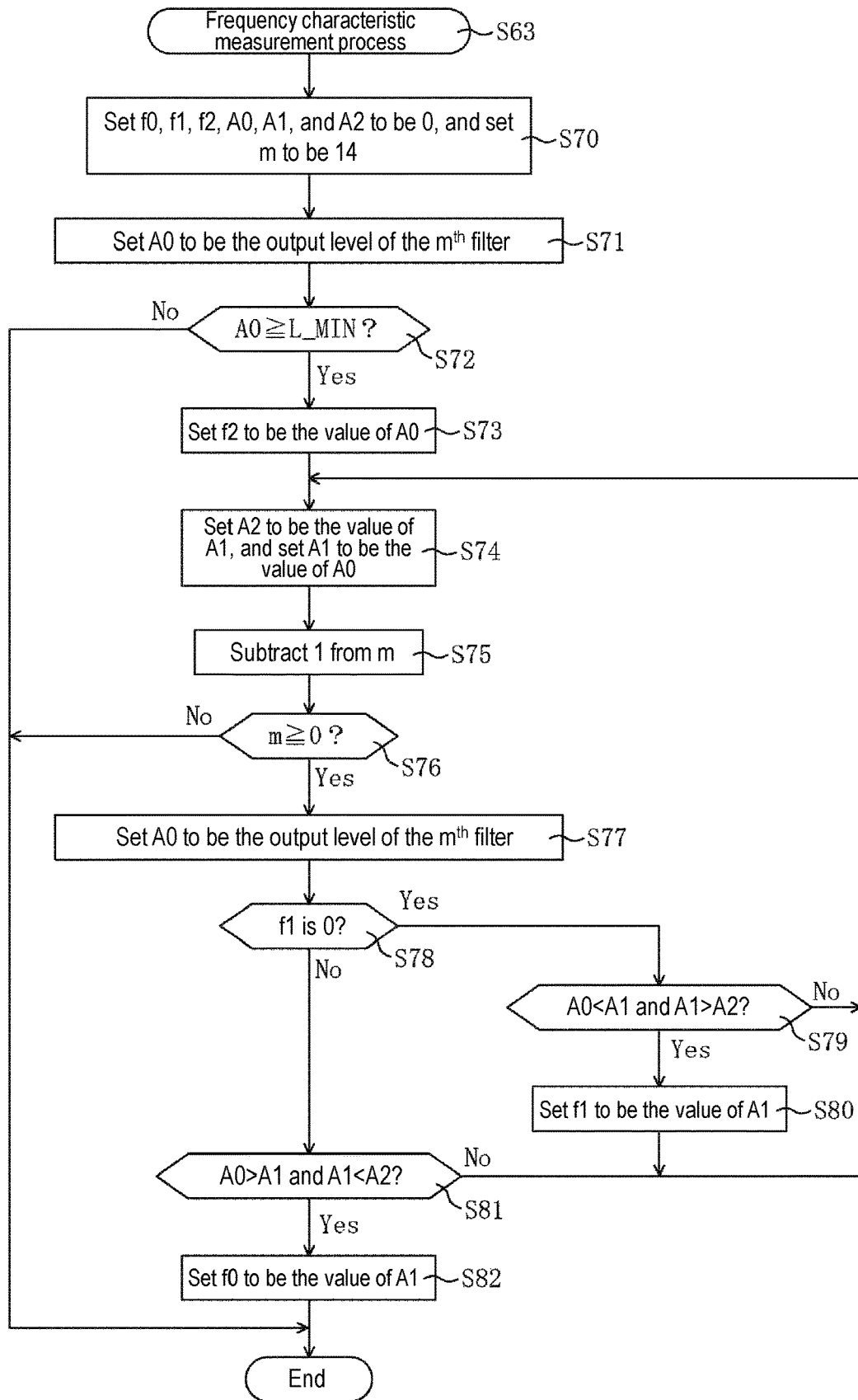
FIG. 11 is a flowchart of the frequency characteristic measurement process in the second embodiment.

FIG. 11 is a flowchart of the frequency characteristic measurement process. The output levels f0, f1, f2, A0, A1, and A2 are set to be 0, respectively, and the counter variable m representing the bandpass filter is set to be 14 (S70). Among these, the output levels f0 to f2 correspond to the output levels described above with reference to FIG. 8B. In addition, the counter variable m corresponds to the "$m^{th}$" bandpass filter described above with reference to FIG. 8A.

After the process of S70, the output level A0 is set to be the output level resulting from applying the $m^{th}$ bandpass filter to the musical tone signal acquired by the ADC 10 (S71). After the process of S71, it is confirmed whether the output level A0 is equal to or greater than L_MIN (S72). In this embodiment, L_MIN is exemplified as "−10 dB," but other values may be used.

In the process of S72, when the output level A0 is equal to or greater than L_MIN (S72: Yes), the output level f2 is set to be the output level A0, that is, the output level resulting from applying the fifteenth (m=14) bandpass filter in FIG. 8A to the musical tone signal acquired by the ADC 10 (S73).

After the process of S73, the output level A2 is set to be the value of the output level A1, and the output level A1 is set to be the value of the output level A0 (S74). After the process of S74, 1 is subtracted from the counter variable m (S75). After the process of S75, it is confirmed whether the counter variable m is equal to or greater than 0 (S76). In the process of S76, when the counter variable m is equal to or greater than 0 (S76: Yes), the output level A0 is set to the output level resulting from applying the $m^{th}$ bandpass filter to the musical tone signal acquired by the ADC 10 (S77).

After the process of S77, it is confirmed whether the output level f1 is 0, that is, whether the output level f1 is set with a value (S78). In the process of S78, if the output level f1 is set with no value (S78: Yes), it is confirmed whether the output level A1 is greater than the output level A0 and whether the output level A1 is greater than the output level A2, that is, whether the output level A1 is the maximum value (S79).

In the process of S79, when the output level A1 is the maximum value (S79: Yes), the output level f1 is set to the output level A1 (S80). On the other hand, in the process of S79, when the output level A1 is not the maximum value (S79: No), the process of S80 is skipped.

In the process of S78, when the output level f1 is set with a value (S78: No), it is confirmed whether the output level A1 is less than the output level A0 and whether the output level A1 is less than the output level A2, that is, whether the output level A1 is the minimum value (S81). In the process of S81, when the output level A1 is the minimum value (S81: Yes), the output level f0 is set to the output level A1 (S82).

When the output level A1 is not the maximum value (S79: No) in the process of S79, when the output level A1 is not the minimum value (S81: No), or after the process of S80, the processes from S74 onward are repeated. When the output level A0 is less than L_MIN (S72: No) in the process of S72, when the counter variable m is less than 0 (S76: No) in the process of S76, or after the process of S82, the frequency characteristic measurement process ends.

Please return to FIG. 10. After the frequency characteristic measurement process of S63, it is confirmed whether all the output levels f0 to f2 are set with values (S64). In the process of S64, when all the output levels f0 to f2 are set with values (S64: Yes), through the process of S24 described above, the resistance value rsp is calculated from the peak value of the voltage Vout acquired in the process of S22. After the process of S24, the rated impedance determination process of S25 described above is executed. After the rated impedance determination process of S25, high-frequency/low-frequency characteristic determination process (S65) is executed. Here, the high-frequency/low-frequency characteristic determination process will be described with reference to FIG. 12A.

Figure 12B:
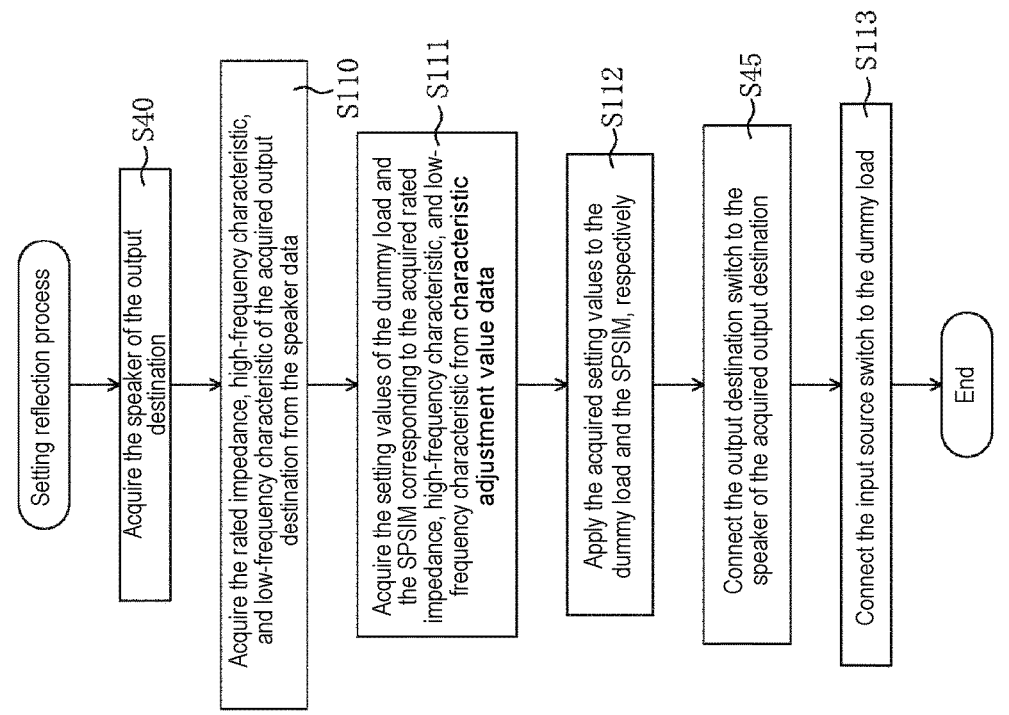
FIG. 12B is a flowchart of the setting reflection process in the second embodiment.
Figure 12A:
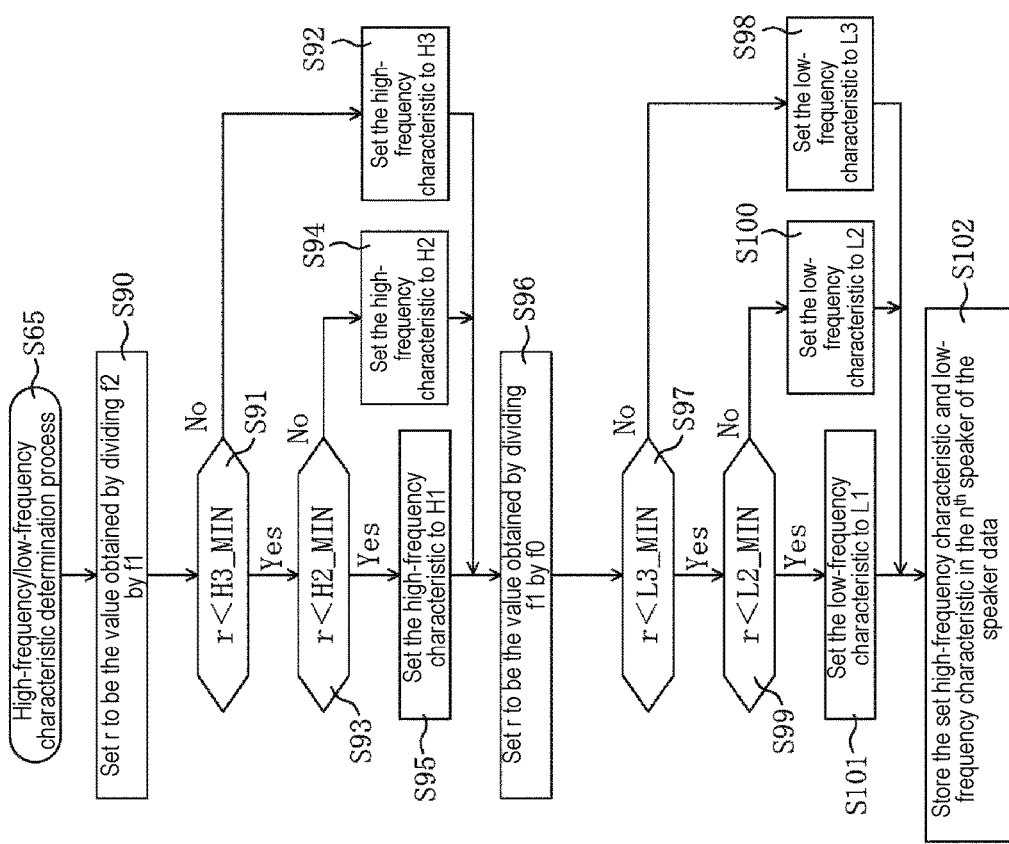
FIG. 12A is a flowchart of the frequency characteristic measurement process in the second embodiment.

FIG. 12A is a flowchart of the high-frequency/low-frequency characteristic determination process. In the high-frequency/low-frequency characteristic determination process, first, r is set to a value obtained by dividing the output level f2 by the output level f1, that is, a value representing the high-frequency characteristic described above in FIG. 8B (S90). After the process of S90, it is confirmed whether r is less than a predetermined threshold value H3_MIN (S91).

In the process of S91, when r is equal to or greater than the threshold value H3_MIN (S91: No), H3 is set as the high-frequency characteristic (S92). As described above with reference to FIG. 9C, in this embodiment, as the high-frequency characteristics, H1, H2, and H3 are set in ascending order of the values obtained by dividing the output level f2 by the output level f1 (that is, the value of r).

On the other hand, when r is less than the threshold value H3_MIN (S91: Yes), it is confirmed whether r is less than a predetermined threshold value H2_MIN (S93). Here, the threshold value H2_MIN is set to a value less than the threshold value H3_MIN. In the process of S93, when r is equal to or greater than the threshold value H2_MIN (S93: No), H2 is set as the high-frequency characteristic (S94). In the process of S93, when r is less than the threshold value H2_MIN (S93: Yes), H1 is set as the high-frequency characteristic (S95).

After the processes of S92, S94, and S95, r is set to a value obtained by dividing the output level f1 by the output level f0, that is, a value representing the low-frequency characteristic described above in FIG. 8B (S96). After the process of S96, it is confirmed whether r is less than a predetermined threshold value L3_MIN (S97).

In the process of S97, when r is equal to or greater than the threshold value L3_MIN (S97: No), L3 is set as the low-frequency characteristic (S98). As described above with reference to FIG. 9C, in this embodiment, as the low-frequency characteristics, L1, L2, and L3 are set in ascending order of the values obtained by dividing the output level f1 by the output level f0 (that is, the value of r).

On the other hand, when r is less than the threshold value L3_MIN (S97: Yes), it is confirmed whether r is less than a predetermined threshold value L2_MIN (S99). Here, the threshold value L2_MIN is set to a value less than the threshold value L3_MIN. In the process of S93, when r is equal to or greater than the threshold value L2_MIN (S99: No), L2 is set as the low-frequency characteristic (S100). In the process of S99, when r is less than the threshold value L2_MIN (S99: Yes), L1 is set as the low-frequency characteristic (S101).

After the processes of S98, S100, and S101, the high-frequency characteristics set in the processes of S92, S94, and S95 and the low-frequency characteristics set in the processes of S98, S100, and S101 are stored in the high-frequency characteristics and low-frequency characteristics of the $n^{th}$ speaker of the speaker data 21b (S102). After the process of S102, the high-frequency/low-frequency characteristic determination process ends.

Please return to FIG. 10. In the process of S64, when any of the output levels f0 to f2 is not set with a value (S64: No), the processes of S24, S25, and S65 are skipped. After the processes of S64 and S65, the output of the inspection signal from the oscillator 12 is stopped by the process of S26, and the characteristic measurement process ends.

Next, the setting reflection process in the second embodiment will be described with reference to FIG. 12B. FIG. 12B is a flowchart of the setting reflection process. The setting reflection process in the second embodiment includes, after acquiring the output destination by the process of S40 described above, acquiring the rated impedance, high-frequency characteristic, and low-frequency characteristic of the acquired output destination from the speaker data 21b (S110).

After the process of S110, the setting values of the dummy load DL and the SPSIM 15 corresponding to the acquired rated impedance, high-frequency characteristic, and low-frequency characteristic are acquired from the characteristic adjustment value data 21c (S111). After the process of S111, the setting values acquired in the process of S41 are applied to the dummy load DL and the SPSIM 15, respectively (S112). After the process of S112, through the process of S45 described above, the output destination switch Sd is connected to the output destination acquired by the process of S40, and the input source switch Sa is connected to the dummy load DL (S113). After the process of S113, the setting reflection process ends.

As described above, even in the amplifier 100 provided with the dummy load DL of the second embodiment, the rated impedance, high-frequency characteristic, and low-frequency characteristic corresponding to the speakers Sp1 and Sp2, to which the output destination switch Sd is connected, are acquired from the rated impedances, high-frequency characteristics, and low-frequency characteristics stored in the processing part 110, and the setting values for the dummy load DL and the SPSIM 15 corresponding to the acquired rated impedance, high-frequency characteristic, and low-frequency characteristic are applied to the dummy load DL and the SPSIM 15. Thus, the input musical tone signal is adjusted so that the input impedance characteristic of the amplifier 100 approximates the rated impedances of the simulated speakers Sp1 and Sp2.

Therefore, when outputting a musical tone signal to the line output Jc4, a musical tone signal suitable for the characteristics of the speakers Sp1 and Sp2 can be output to the line output Jc4 without providing an amplifier 100 for each of the simulated speakers Sp1 and Sp2. Thus, switching between the simulated speakers Sp1 and Sp2 can be realized with a minimum configuration of one amplifier 100.

Furthermore, like the amplifier 1 of the first embodiment, the rated impedances, high-frequency characteristics, and low-frequency characteristics of the speakers Sp1 and Sp2 are analyzed based on the inspection signal output from the oscillator 12, and stored in the processing part 110. Since the performer or the like who plays the electric musical instrument does not need to manually input the rated impedances, high-frequency characteristics, and low-frequency characteristics of the speakers Sp1 and Sp2 to the processing part 110, it is possible to save the performer or the like from the trouble of setting the amplifier 100, and improve the usability of the amplifier 100.

Although the disclosure has been described based on the above embodiments, it can be easily inferred that various improvements and modifications are possible.

In the above embodiments, the output part 3 is provided with the jacks Jc2 and Jc3 to connect two speakers, but the disclosure is not limited thereto. Three or more speakers may be connected. In this case, the speaker data 21b may store the rated impedances, etc. for the speakers that can be connected to the output part 3.

In addition, only one speaker may be connected to the output part 3. In such a case, the analyzed rated impedance, etc. of the speaker may be stored in the speaker data 21b, and the damping factor Df and the dummy load DL may be set according to the rated impedance, etc. stored in the speaker data 21b. Thus, even if only one speaker is connected, a musical tone signal suitable for the rated impedance, etc. of the speaker connected can be output from the amplifiers 1 and 100 without requiring the performer or the like to manually input the rated impedance, etc. to the processing parts 11 and 110.

In the above embodiments, the inspection signal is output from the oscillator 12. However, the disclosure is not limited thereto, and the inspection signal may be output from the processing parts 11 and 110. In this case, the inspection signal may be generated by the CPU 20 of the processing parts 11 and 110 and output, audio data of the inspection signal may be stored in advance in the flash ROM 21, etc., and the stored audio data of the inspection signal may be reproduced and output.

In the above embodiments, a sine wave is output from the oscillator 12 as the inspection signal in the analysis of the rated impedance, but the disclosure is not limited thereto. For example, white noise may be used as the inspection signal as in the analysis of the high-frequency characteristics and low-frequency characteristics of the second embodiment. In this case, the processing parts 11 and 110 may acquire the output level of the musical tone signal detected by the ADC 10 using a bandpass filter with a center frequency of 300 Hz, and use a voltage based on the acquired output level as the peak value of the voltage Vout.

In the first embodiment, the damping factor Df is exemplified for adjusting the output impedance characteristic. However, the disclosure is not limited thereto, and a device other than the damping factor Df may be used for adjusting the output impedance characteristic. Besides, in the second embodiment, the dummy load DL is exemplified for adjusting the input impedance characteristic. However, the disclosure is not limited thereto, and a device other than the dummy load DL may be used for adjusting the input impedance characteristic.

In the first embodiment, the damping factor Df is implemented by a plurality of resistors R3a to R3e, but the disclosure is not limited thereto. For example, variable resistors that are capable of setting the same resistance values as the resistors R3a to R3e may be used in place of the resistors R3a to R3e.

Moreover, although the damping factor Df is composed of one group of resistor R3a to R3e (a plurality of resistors such as resistors R3a to R3e are hereinafter referred to as a "resistor group"), the disclosure is not limited thereto, and the damping factor Df may be composed of a plurality of resistor groups.

In this case, for example, two resistor groups may be provided, one contributing to the high-frequency characteristics (the frequency band for detecting the output level f2 in FIG. 8B) and the other contributing to the low-frequency characteristics (the frequency band for detecting the output level f1 in FIG. 8B). Furthermore, as in the second embodiment, in addition to the rated impedances, the high-frequency characteristics and low-frequency characteristics may also be analyzed in the analysis of the speakers Sp1 and Sp2, and the resistors to be used in the resistor groups for the high-frequency characteristics and low-frequency characteristics may be selected according to the rated impedances, high-frequency characteristics, and low-frequency characteristics.

In the first embodiment, the characteristic adjustment part 2 is provided with the level adjustment part Lv, but the disclosure is not limited thereto, and the level adjustment part Lv may be omitted from the characteristic adjustment part 2. Further, the characteristic adjustment part 2 may be provided with the SPSIM 15 of the second embodiment, and the musical tone signal output from the operational amplifier Ap may be set with a frequency characteristic equivalent to the frequency characteristics of the speakers Sp1 and Sp2 by the SPSIM 15. In this case, the setting value of the frequency characteristic set in the SPSIM 15 may be set according to the rated impedances of the speakers Sp1 and Sp2 used for output.

In the second embodiment, the characteristic adjustment part 20 is provided with the SPSIM 15, but the disclosure is not limited thereto, and the SPSIM 15 may be omitted from the characteristic adjustment part 20.

In the second embodiment, 15 bandpass filters are used to detect the output level of each frequency band. However, the number of bandpass filters is not limited to 15, and may be 15 or less or 15 or more. Further, the frequency band is not necessarily divided by a plurality of bandpass filters as shown in FIG. 8A. For example, a large number of bandpass filters may be set near the frequency band where the output levels f0 to f2 can be observed, and a small number of bandpass filters may be set for other frequency bands. Thus, it is possible to observe the output levels f0 to f2 with higher accuracy, and avoid an increase in the number of bandpass filters. In addition, the frequency band from 40 Hz to 1 kHz of the musical tone signal may be divided into frequency bands corresponding to octaves.

Furthermore, the output level of each frequency band is not necessarily detected by a bandpass filter, and may be acquired by other filters such as a high-pass filter and a low-pass filter. In the second embodiment, the setting values such as the dummy load DL according to the rated impedances, high-frequency characteristics, and low-frequency characteristics of the speakers Sp1 and Sp2 are stored in the characteristic adjustment value data 21c, and the setting values of the dummy load DL, etc. corresponding to the analyzed rated impedances, high-frequency characteristics, and low-frequency characteristics are acquired from the characteristic adjustment value data 21c. However, the disclosure is not limited thereto. For example, the rated impedances may be omitted from the characteristic adjustment value data 21c, the setting values of the dummy load DL, etc. corresponding to the high-frequency characteristics and low-frequency characteristics may be stored, and the setting values of the dummy load DL, etc. corresponding to the analyzed high-frequency characteristics and low-frequency characteristics may be acquired from the characteristic adjustment value data 21c.

Similarly, the high-frequency characteristics (or low-frequency characteristics) may be omitted from the characteristic adjustment value data 21c, the setting values of the dummy load DL, etc. corresponding to the rated impedances and low-frequency characteristics (or high-frequency characteristics) may be stored, and the setting values of the dummy load DL, etc. corresponding to the analyzed rated impedances and low-frequency characteristics (or high-frequency characteristics) may be acquired from the characteristic adjustment value data 21c.

Further, characteristics related to the speakers Sp1 and Sp2 other than the rated impedances, high-frequency characteristics, and low-frequency characteristics may be set, the setting values of the dummy load DL, etc. corresponding to the rated impedances, high-frequency characteristics, low-frequency characteristics, and other characteristics may be stored in the characteristic adjustment value data 21c, and the setting values of the dummy load DL, etc. corresponding to the analyzed rated impedances, high-frequency characteristics, low-frequency characteristics, and other characteristics may be acquired from the characteristic adjustment value data 21c.

In the above embodiments, the amplifiers 1 and 100 amplify a musical tone signal input from an electric guitar or electric bass, but the disclosure is not limited thereto. The amplifiers 1 and 100 may be configured by amplifiers for other musical instruments and other amplifiers such as audio amplifiers and headphone amplifiers.

In the above embodiments, the amplifiers 1 and 100 and the speakers Sp1 and Sp2 are separate devices, but the disclosure is not limited thereto. For example, the speakers Sp1 and Sp2 may be built in the amplifiers 1 and 100, or the amplifiers 1 and 100 may be built in the speakers Sp1 and Sp2.

In the above embodiments, the control program 21a is stored in the flash ROM 21 of the processing parts 11 and 110, and is operated on the processing parts 11 and 110. However, the disclosure is not limited thereto, and the control program 21a may be operated by a PC (personal computer), a mobile phone, a smart phone, a tablet terminal, or the like. In this case, the switches Sa to Sd, the characteristic adjustment parts 2 and 20, and the output part 3 may be connected to the PC, etc.

The numerical values given in the above embodiments are examples, and it is certainly possible to use other numerical values.

What is claimed is:

1. An amplifier, comprising an amplification section comprising an operation amplifier amplifying a musical tone signal input from an electric musical instrument, the amplifier being connected with a plurality of speakers, the amplifier comprising:
a selection section comprising an output destination switch selecting a speaker for outputting the musical tone signal amplified by the amplification section, among the plurality of speakers;
a storage section comprising a memory storing a characteristic adjustment value which is a value for adjusting an output impedance characteristic or an input impedance characteristic of the amplifier according to a characteristic of the speaker for each of the plurality of speakers;
an acquisition section comprising a processor acquiring the characteristic adjustment value corresponding to the speaker selected by the selection section from the characteristic adjustment values stored in the storage section; and
a characteristic adjustment section comprising a damping factor adjusting the output impedance characteristic or the input impedance characteristic based on the characteristic adjustment value acquired by the acquisition section.

2. The amplifier according to claim 1, further comprising:
an inspection signal output section comprising an oscillator outputting a predetermined inspection signal to the speaker selected by the selection section via the amplification section; and
an observation section comprising a digital analog converter observing a resulting inspection signal output to the speaker by the inspection signal output section,
the processor is configured to analyze the characteristic of the speaker based on the resulting inspection signal observed by the observation section, and
in the storage section, the characteristic adjustment value corresponds to the characteristic of the speaker analyzed by the analysis section in association with the speaker.

3. The amplifier according to claim 2, wherein the characteristic adjustment value is a value for changing a negative feedback rate of the musical tone signal output from the amplification section to the amplification section according to a rated impedance of the speaker.

4. The amplifier according to claim 3, wherein the characteristic adjustment section adjusts the output impedance characteristic by changing the negative feedback rate to the amplification section based on the characteristic adjustment value acquired by the acquisition section.

5. The amplifier according to claim 4, wherein the characteristic adjustment value is a value for changing the negative feedback rate of the musical tone signal output from the amplification section to the amplification section according to the rated impedance of the speaker so that the musical tone signal output from the amplification section has a predetermined damping factor.

6. The amplifier according to claim 2, wherein the characteristic adjustment value is a value for adjusting a characteristic of the musical tone signal input to the amplification section so that the input impedance characteristic approximates the rated impedance of the speaker selected by the selection section.

7. The amplifier according to claim 6, wherein the characteristic adjustment section adjusts the input impedance characteristic by adjusting the characteristic of the musical tone signal input to the amplification section based on the characteristic adjustment value acquired by the acquisition section.

8. The amplifier according to claim 7, wherein the characteristic adjustment section comprises a dummy load that adjusts the characteristic of the musical tone signal input from the electric musical instrument via a vacuum tube amplifier based on the characteristic adjustment value acquired by the acquisition section.

9. A method for adjusting a characteristic of an amplifier which is connected with a plurality of speakers, the method comprising:
selecting a speaker for outputting a musical tone signal amplified, among the plurality of speakers;
storing a characteristic adjustment value which is a value for adjusting an output impedance characteristic or an input impedance characteristic of the amplifier according to a characteristic of the speaker for each of the plurality of speakers;
acquiring the characteristic adjustment value corresponding to the speaker selected, from the characteristic adjustment values stored; and
adjusting the output impedance characteristic or the input impedance characteristic based on the characteristic adjustment value acquired.

10. The method for adjusting the characteristic of the amplifier according to claim 9, further comprising:
amplifying a predetermined inspection signal and outputting an amplified inspection signal to the speaker selected;
observing a resulting inspection signal output to the speaker;
analyzing the characteristic of the speaker based on the resulting inspection signal observed; and
storing the characteristic adjustment value corresponding to the analyzed characteristic of the speaker in association with the speaker.

11. The method for adjusting the characteristic of the amplifier according to claim 10, wherein the amplifier comprises an amplification section amplifying a musical tone signal input from an electric musical instrument, and
the characteristic adjustment value is a value for changing a negative feedback rate of the musical tone signal output from the amplification section to the amplification section according to a rated impedance of the speaker.

12. The method for adjusting the characteristic of the amplifier according to claim 11, wherein adjusting the characteristic is to adjust the output impedance characteristic by changing the negative feedback rate to the amplification section based on the characteristic adjustment value acquired.

13. The method for adjusting the characteristic of the amplifier according to claim 12, wherein the characteristic adjustment value is a value for changing the negative feedback rate of the musical tone signal output from the amplification section to the amplification section according to the rated impedance of the speaker so that the musical tone signal output from the amplification section has a predetermined damping factor.

14. The method for adjusting the characteristic of the amplifier according to claim 11, wherein the characteristic adjustment value is a value for adjusting a characteristic of the musical tone signal input to the amplification section so that the input impedance characteristic approximates the rated impedance of the speaker selected.

15. The method for adjusting the characteristic of the amplifier according to claim 14, wherein adjusting the characteristic is to adjust the input impedance characteristic by adjusting the characteristic of the musical tone signal input to the amplification section based on the characteristic adjustment value acquired.

16. The method for adjusting the characteristic of the amplifier according to claim 15, wherein adjusting the characteristic comprises a dummy load that adjusts the characteristic of the musical tone signal input from the electric musical instrument via a vacuum tube amplifier based on the characteristic adjustment value acquired.

17. A method for adjusting a characteristic of an amplifier which is connected with a plurality of speakers, the method comprising:
selecting a speaker for outputting a musical tone signal amplified, among the plurality of speakers;
storing a characteristic adjustment value which is a value for adjusting an output impedance characteristic or an input impedance characteristic of the amplifier according to a characteristic of the speaker for each of the plurality of speakers; and
adjusting the output impedance characteristic or the input impedance characteristic based on the characteristic adjustment value corresponding to the speaker selected.

18. The method for adjusting the characteristic of the amplifier according to claim 17, further comprising:
amplifying a predetermined inspection signal and outputting an amplified inspection signal to the speaker selected;
observing a resulting inspection signal output to the speaker;
analyzing the characteristic of the speaker based on the result inspection signal observed; and
storing the characteristic adjustment value corresponding to the analyzed characteristic of the speaker in association with the speaker.

19. The method for adjusting the characteristic of the amplifier according to claim 18, wherein the amplifier comprises an amplification section amplifying a musical tone signal input from an electric musical instrument, and
the characteristic adjustment value is a value for changing a negative feedback rate of the musical tone signal output from the amplification section to the amplification section according to a rated impedance of the speaker.

20. The method for adjusting the characteristic of the amplifier according to claim 19, wherein adjusting the characteristic is to adjust the output impedance characteristic by changing the negative feedback rate to the amplification section based on the characteristic adjustment value acquired.

* * * * *